(12) United States Patent  
Wang et al.

(10) Patent No.: US 12,068,368 B2  
(45) Date of Patent: Aug. 20, 2024

(54) SHALLOW TRENCH ISOLATION (STI) CONTACT STRUCTURES AND METHODS OF FORMING SAME

(71) Applicant: Taiwan Semiconductor Manufacturing Co., Ltd., Hsinchu (TW)

(72) Inventors: Tai-Yuan Wang, New Taipei (TW); Shu-Fang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 58 days.

(21) Appl. No.: 17/844,533

(22) Filed: Jun. 20, 2022

(65) Prior Publication Data

US 2022/0320279 A1 Oct. 6, 2022

Related U.S. Application Data

(62) Division of application No. 16/881,933, filed on May 22, 2020, now Pat. No. 11,374,089.

(51) Int. Cl.

| | |
|---|---|
| *H01L 21/311* | (2006.01) |
| *H01L 21/762* | (2006.01) |
| *H01L 21/8234* | (2006.01) |
| *H01L 29/06* | (2006.01) |
| *H01L 29/78* | (2006.01) |

(52) U.S. Cl.  
CPC .... *H01L 29/0653* (2013.01); *H01L 21/76229* (2013.01); *H01L 21/823431* (2013.01); *H01L 21/823481* (2013.01); *H01L 29/785* (2013.01); *H01L 2029/7858* (2013.01)

(58) Field of Classification Search  
None  
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |

(Continued)

*Primary Examiner* — Joseph C. Nicely  
*Assistant Examiner* — Lamont B Koo  
(74) *Attorney, Agent, or Firm* — Slater Matsil, LLP

(57) ABSTRACT

A method of forming a semiconductor device includes forming a first semiconductor strip protruding above a first region of a substrate and a second semiconductor strip protruding above a second region of the substrate, forming an isolation region between the first semiconductor strip and the second semiconductor strip, forming a gate stack over and along sidewalls of the first semiconductor strip and the second semiconductor strip, etching a trench extending into the gate stack and isolation regions, the trench exposing the first region of the substrate and the second region of the substrate, forming a dielectric layer on sidewalls and a bottom surface of the trench and filling a conductive material over the dielectric layer and in the trench to form a contact, where the contact extends below a bottommost surface of the isolation region.

20 Claims, 45 Drawing Sheets

(56) References Cited

U.S. PATENT DOCUMENTS

| | | |
|---|---|---|
| 2015/0243552 A1 | 8/2015 | Lu et al. |
| 2015/0295089 A1 | 10/2015 | Huang et al. |
| 2019/0109193 A1 | 4/2019 | Liaw |
| 2019/0139836 A1 | 5/2019 | Chu et al. |

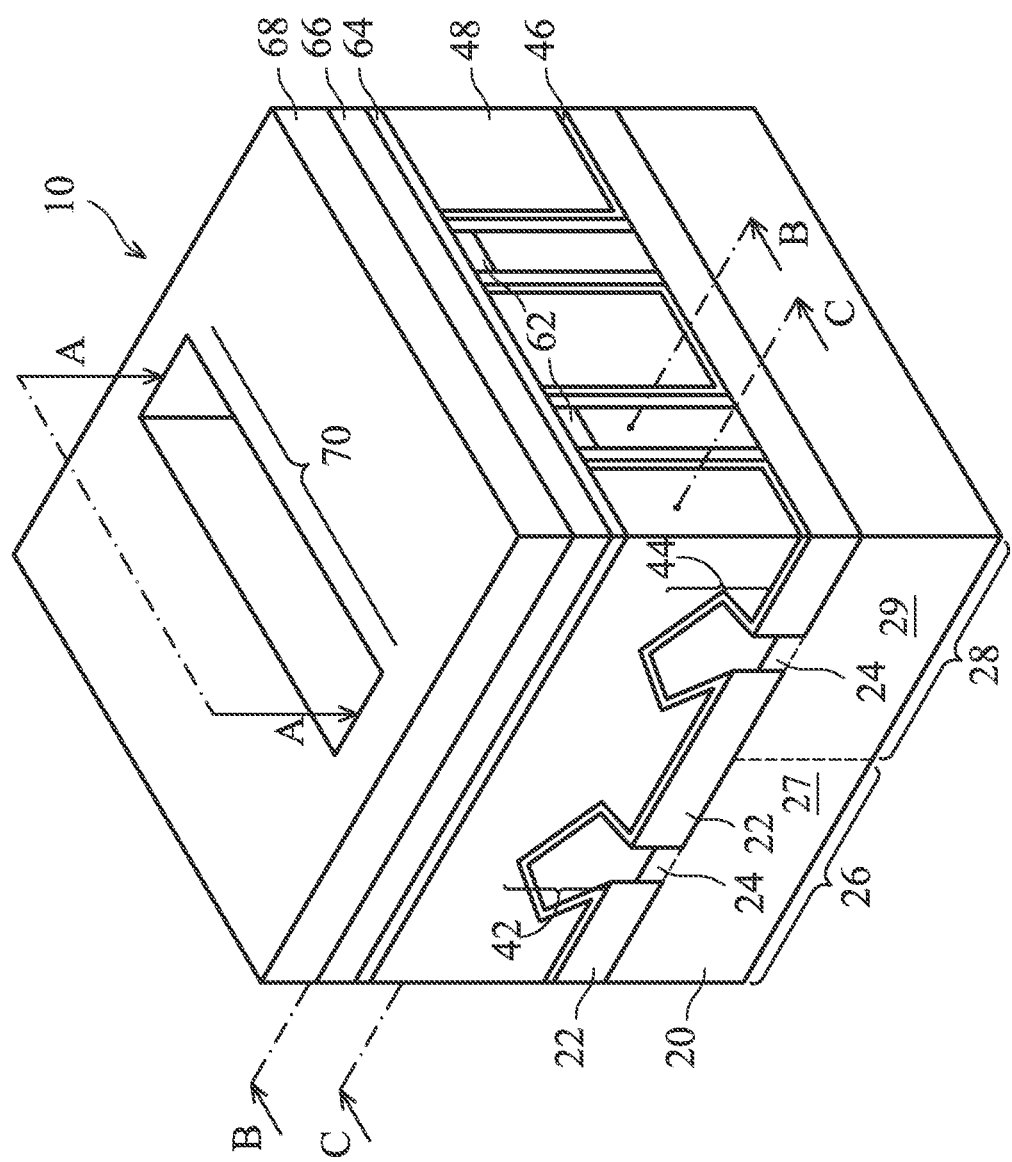

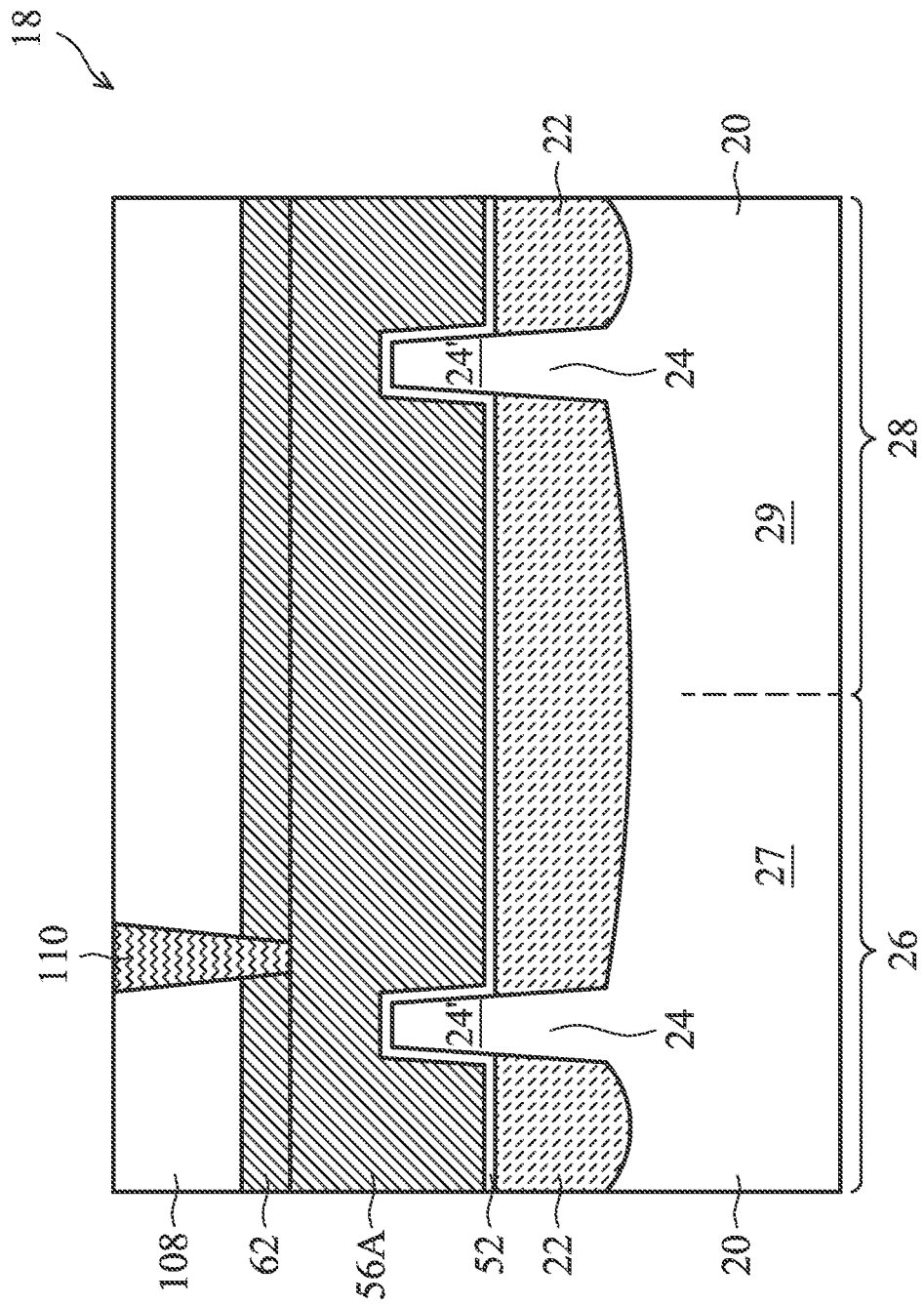

SHALLOW TRENCH ISOLATION (STI) CONTACT STRUCTURES AND METHODS OF FORMING SAME

PRIORITY CLAIM AND CROSS-REFERENCE

This patent is a divisional of U.S. application Ser. No. 16/881,933, filed on May 22, 2020, which applications is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 5C, 6A, 6B, 7A, 7B, 8A, 8B, 9, 10A, 10B, 10C, 11A, 11B, 11C, 12A, 12B, 13A, 13B, 14, 15A, 15B, 16, 19A, 19B and 19C illustrate the perspective views, top views, side views and cross-sectional views of intermediate stages in the formation of Fin Field-Effect Transistors (FinFETs) and a cut-metal-gate process in accordance with some embodiments.

FIGS. 23, 24A, 24B and 25 illustrate an alternative embodiment of the present disclosure in which the epitaxy regions are biased at $V_{DD}$.

DETAILED DESCRIPTION

Figure 1:
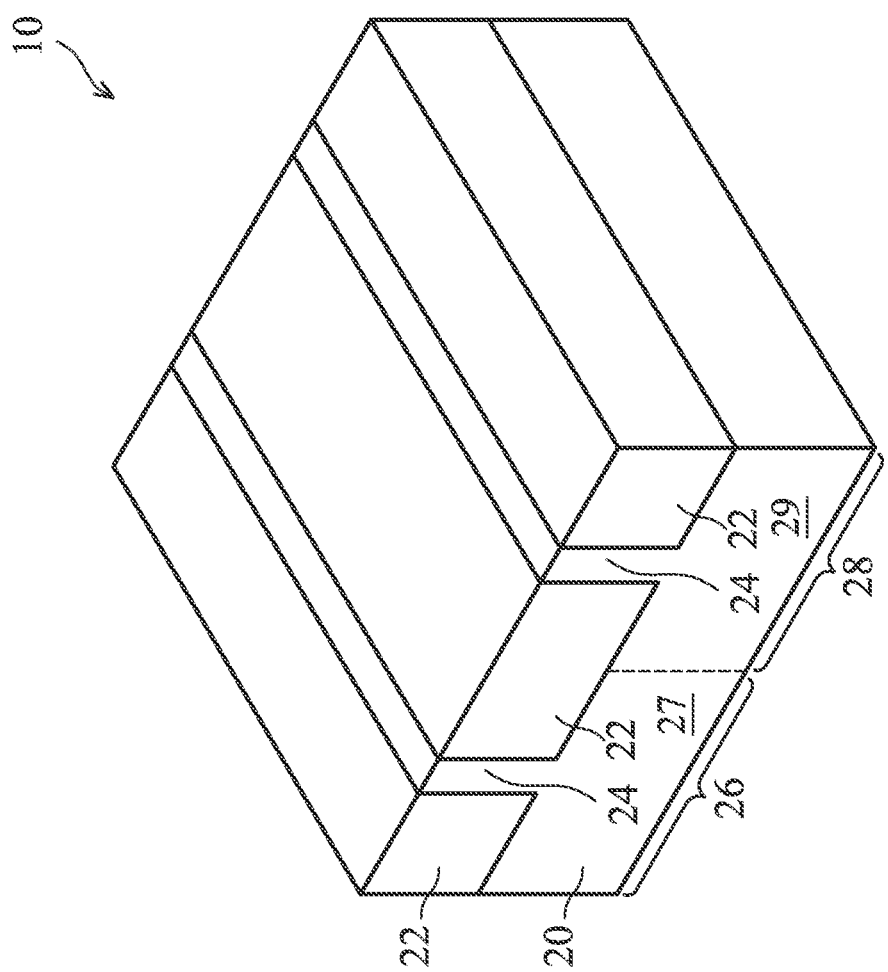

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, a contact extends to a STI region, such that a voltage can be applied to the STI region.

Various embodiments may also include methods applied to, but not limited to, the formation of a contact passing vertically through a STI region and into a well region below the STI. The increase in isolation leakage is a natural consequence of aggressive downscaling the critical dimension of CMOS circuits. Advantageous features of one or more embodiments disclosed herein may include the ability to reduce the isolation leakage between two adjacent circuits by applying a voltage on a contact to a STI region that separates the two adjacent circuits. In addition, the contact formation can be incorporated in a cut-metal-gate process, thereby simplifying the process.

Figure 30:
FIG. 30 illustrates a process flow for forming FinFETs and an STI contact structure in accordance with some embodiments.

FIGS. 1-4, 5A, 5B, 5C, 6A, 6B, 7A, 7B, 8A, 8B, 9, 10A, 10B, 10C, 11A, 11B, 11C, 12A, 12B, 13A, 13B, 14, 15A, 15B, 16, 19A, 19B and 19C illustrate the perspective views, top views, side views and cross-sectional views of intermediate stages in the formation of Fin Field-Effect Transistors (FinFETs) and a cut-metal-gate process in accordance with some embodiments. The processes are also reflected schematically in the process flow 200 as shown in FIG. 30.

FIG. 1 illustrates a perspective view of an initial structure. The initial structure includes wafer 10, which further includes substrate 20. Substrate 20 may be a semiconductor substrate, such as a bulk semiconductor, a semiconductor-on-insulator (SOI) substrate, or the like. The substrate 20 may be a silicon substrate. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Substrate 20 may be doped with p-type and n-type impurities in different regions. The substrate 20 has a region 26 and a region 28. The region 26 can be for forming p-type devices, such as PMOS transistors, e.g., p-type FinFETs and is doped to form an n-well 27. The region 28 can be for forming n-type devices, such as NMOS transistors, e.g., n-type FinFETs and is doped to form a p-well 29. The region 26 may be adjacent to region 28. In some embodiments, the region 26 and the region 28 are used to form different types of devices, such as one region being for n-type devices and the other for p-type devices.

Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. STI regions 22 are formed to extend from a top surface of substrate 20 into substrate 20 and between semiconductor strips 24 by depositing insulation material which may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, STI regions 22 are silicon oxide formed by a FCVD process. An anneal process may be performed once the insulation material is formed. Further, STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD).

In accordance with some embodiments of the present disclosure, semiconductor strips 24 are parts of the original substrate 20, and the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material. The semiconductor strips 24 in region 26 and region 28 are separated by STI region 22 between them.

Figure 2:
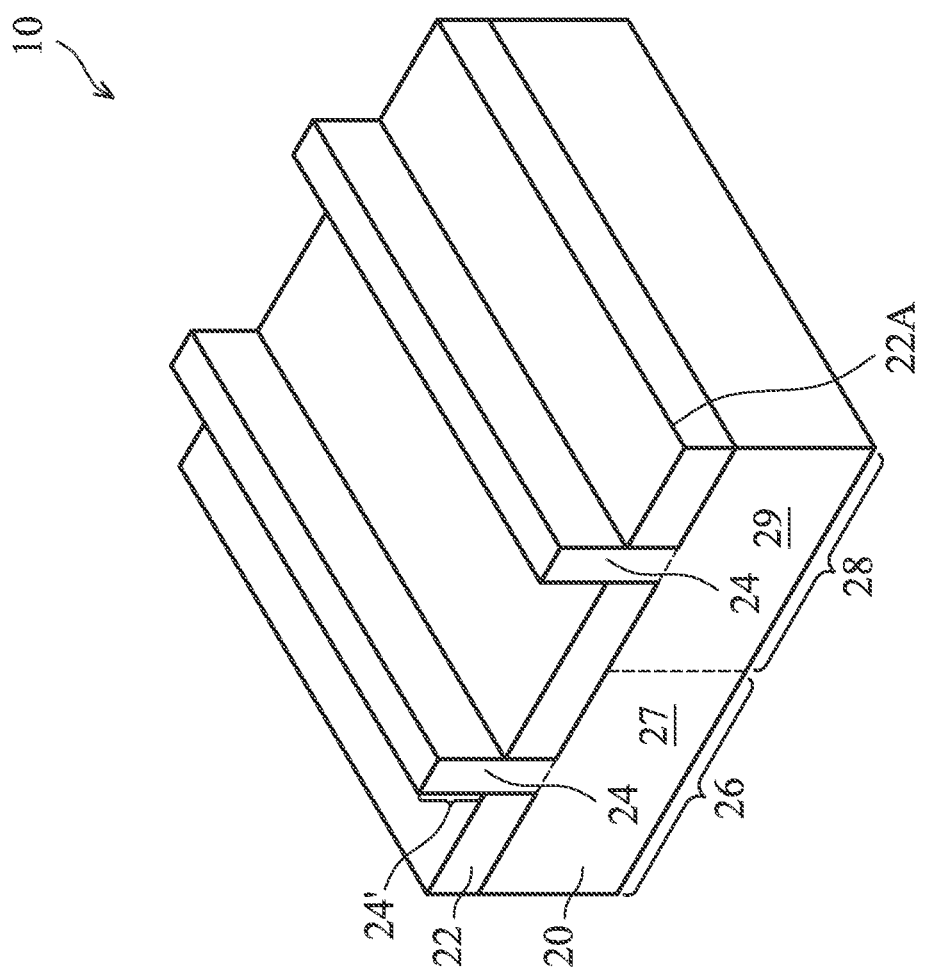

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 210 in the process flow 200 as shown in FIG. 30. The recessing may be performed using a dry etching process, wherein HF3 and NH3 are used as the etching gases. In accordance with alternative embodiments of the present disclosure, the recessing of STI regions 22 is performed using a wet etch process. The etching chemical may include HF solution, for example.

The STI region 22 between the wells 27/29 is used to electrically isolate devices in region 26 from devices in region 28. Therefore a FinFET formed in the n-well 27 can be electrically isolated from a FinFET formed in the p-well 29. However, isolation leakage current between the wells 27/29 can still occur when the doping concentrations of the n-well 27 and p-well 29 are not balanced. Thus, in various embodiments, a contact is formed through the STI region 22A and a voltage is applied to the contact, which improve isolation between n-well 27 and p-well 29 as described in greater detail below.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
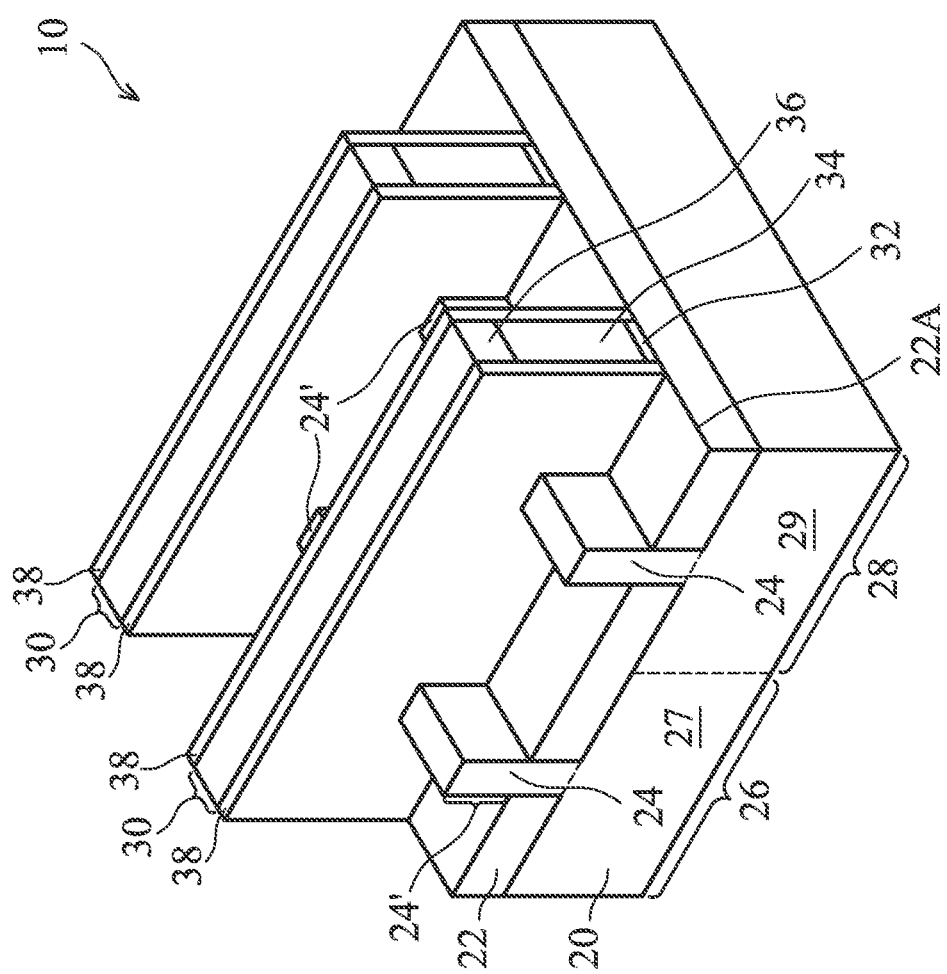

Referring to FIG. 3, dummy gate stacks 30 are formed on the top surfaces and the sidewalls of protruding fins 24'. The respective process is illustrated as process 212 in the process flow 200 as shown in FIG. 30. Dummy gate stacks 30 may include dummy gate dielectrics 32 and dummy gate electrodes 34 over dummy gate dielectrics 32. Dummy gate dielectrics 32 may be, for example, silicon oxide, silicon nitride, a combination thereof, or the like, and may be deposited or thermally grown according to acceptable techniques. Dummy gate electrodes 34 may be deposited over the dummy gate dielectrics 32 and then planarized, such as by a CMP. Dummy gate electrodes 34 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate electrodes 34 may be deposited by physical vapor deposition (PVD), CVD, sputter deposition, or other techniques known and used in the art for depositing conductive materials. The dummy gate electrodes 34 may be made of other materials that have a high etching selectivity from the etching of isolation regions. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Hard mask layers 36 may be patterned using acceptable photolithography and etching techniques and this pattern transferred to dummy gate electrode 34. This pattern may also be transferred to the dummy gate dielectrics 32 by an acceptable etching technique. The patterning of hard mask layers 36 is therefore used to separate each of the dummy gate electrodes 34 from adjacent dummy gate electrodes. Dummy gate stacks 30 may cross over a single one or a plurality of protruding fins 24' and/or STI regions 22. Dummy gate stacks 30 extend along lengthwise directions, which are perpendicular to the lengthwise directions of protruding fins 24'.

Next, implants for lightly doped source/drain (LDD) regions (not explicitly illustrated) may be performed. In the embodiments with different device types, a mask, such as a photoresist, may be formed over the region 26, while exposing the region 28, and appropriate type (e.g., n-type or p-type) impurities may be implanted into the protruding fins 24' in the region 28. The mask may then be removed. Subsequently, a mask, such as a photoresist, may be formed over the region 28 while exposing the region 26, and appropriate type impurities may be implanted into the protruding fins 24' in the region 26. The mask may then be removed. The p-type impurities may be boron, BF2, or the like and the n-type impurities may be phosphorus, arsenic, or the like. The lightly doped source/drain regions may have a concentration of impurities of from about $10^{15}$ cm$^{-3}$ to about $10^{16}$ cm$^{-3}$. An anneal may be used to activate the implanted impurities.

Gate spacers 38 are formed on the sidewalls of dummy gate stacks 30. The gate spacers 38 may be formed by conformally depositing an insulating material and subsequently anisotropically etching the insulating material. The insulating material may be a dielectric material such as silicon nitride, silicon oxide, silicon carbo-nitride, silicon oxynitride, silicon oxy-carbo-nitride, or the like, and may have a single-layer structure or a multi-layer structure including a plurality of dielectric layers. In some embodiments, the gate spacers 38 include a seal spacer (e.g., an oxide layer) and an additional spacer (e.g., a nitride layer) on the seal spacer. The LDD regions may be formed between the seal spacer and the additional spacer such that the seal spacer helps to define a region implanted by the LDD implantation process. In other embodiments, the LDD regions are formed prior to any portion of the gate spacers 38 being formed.

Figure 4:
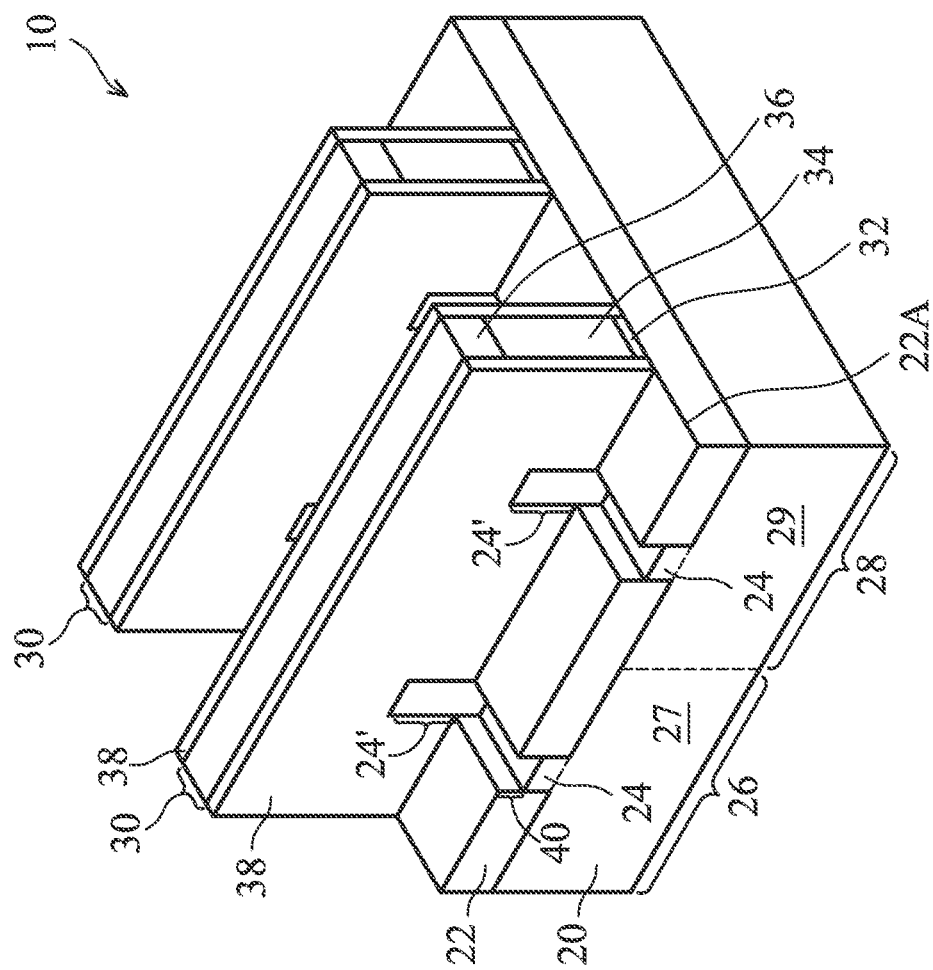

Referring to FIG. 4, an etching step (referred to as fin recessing hereinafter) is performed to etch the portions of protruding fins 24' that are not covered by dummy gate stack 30 and gate spacers 38. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. Recesses 40 are accordingly formed in protruding fins 24', and extending between STI regions 22. Recesses 40 are located on the opposite sides of dummy gate stacks 30.

Figure 5A:
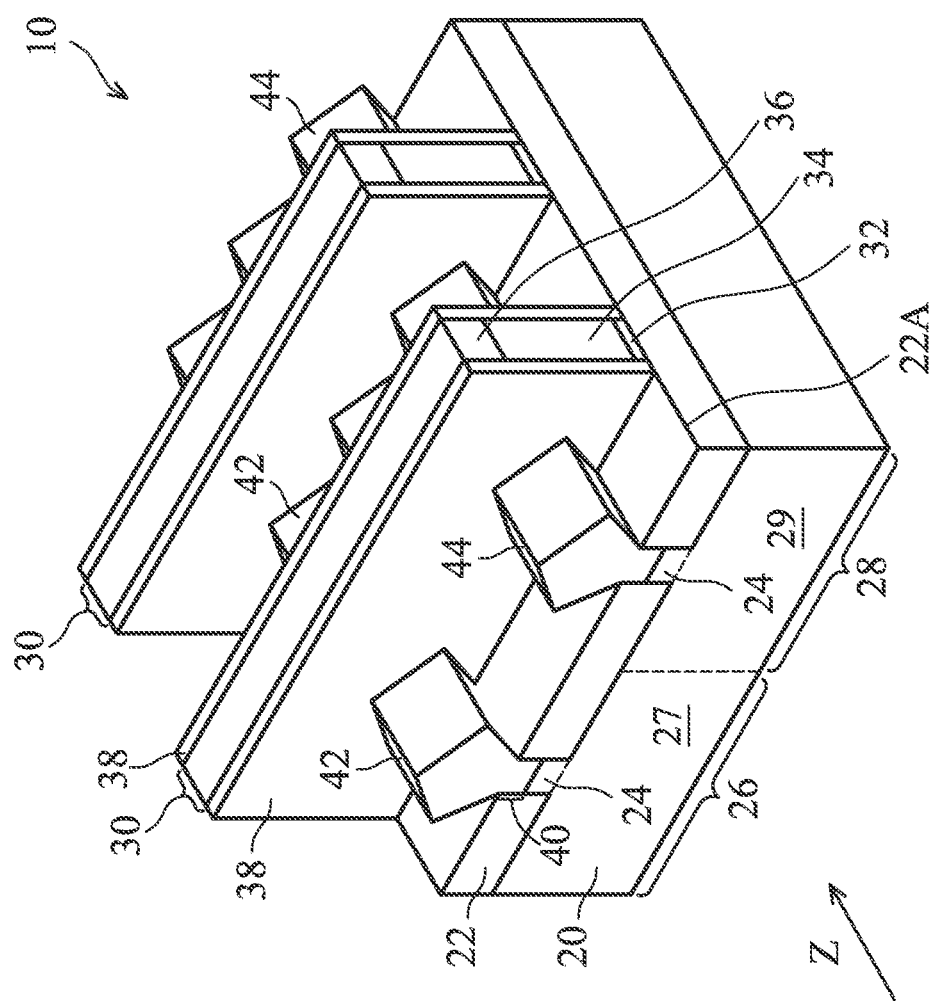

Referring to FIG. 5A, epitaxy regions (source/drain regions) 42 in region 26 and epitaxy regions (source/drain regions) 44 in region 28 are formed by selectively growing a semiconductor material in recesses 40. The respective process is illustrated as process 216 in the process flow 200 as shown in FIG. 30. In accordance with some embodiments, epitaxy regions 42/44 include silicon germanium, silicon, silicon carbon, combinations thereof, or the like. Depending on whether the resulting FinFET is a p-type FinFET or an n-type FinFET, a p-type or an n-type impurity may be in-situ doped with the proceeding of the epitaxy. For example, in region 26, the resulting FinFET may be a p-type FinFET, and silicon boron (SiB), silicon germanium boron (SiGeB), GeB, or the like may be grown for epitaxy regions 42. Conversely, when the resulting FinFET is an n-type FinFET, such as in region 28, silicon phosphorous (SiP), silicon carbon phosphorous (SiCP), silicon, or the like, may be grown for epitaxy regions 44. In accordance with alternative embodiments of the present disclosure, epitaxy regions 42/44 are formed of a III-V compound semiconductor such as GaAs, InP, GaN, InGaAs, InAlAs, GaSb, AlSb, AlAs, AlP, GaP, combinations thereof, multi-layers thereof, or the like. After epitaxy regions 42/44 fully fill recesses 40, epitaxy regions 42/44 start expanding horizontally, and facets may be formed.

Figure 5B:
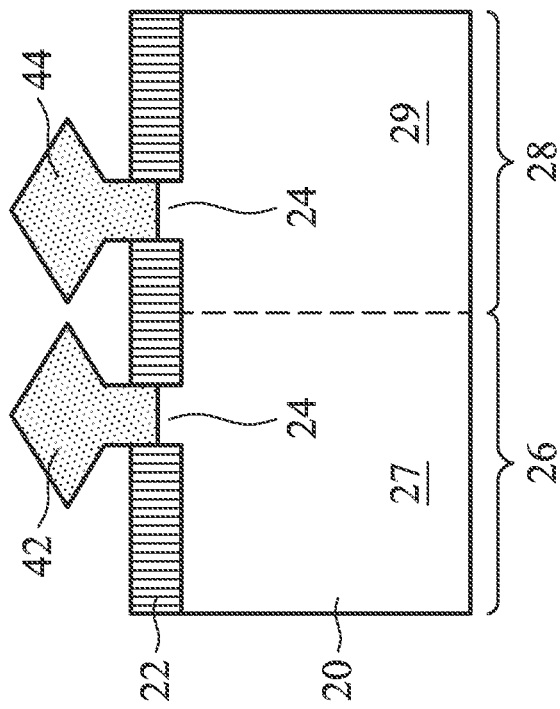
Figure 5C:
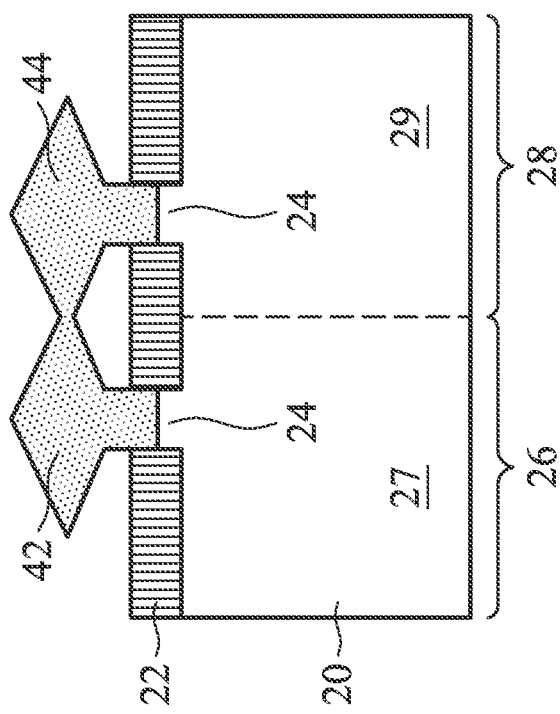

Although FIG. 5A illustrates the transistors in regions 26 and 28 as having single epitaxy regions 42/44 on each side of dummy gate stacks 30, transistors with multiple epitaxy regions 42/44 on each side of dummy gate stacks 30 may be formed as well. In such embodiments and as a result of the epitaxy processes used to form the epitaxial source/drain regions 42/44 in the region 26 and the region 28, upper surfaces of the epitaxial source/drain regions have facets which expand laterally outward beyond sidewalls of semiconductor strips 24. In some embodiments, these facets cause adjacent source/drain regions 42 and 44 of a same FinFET to merge as illustrated by FIG. 5B. In other embodiments, adjacent source/drain regions 42 and 44 remain separated after the epitaxy process is completed as illustrated by FIG. 5C. Both FIG. 5B and FIG. 5C are side views of wafer 10 seen in the direction Z of FIG. 5A.

After the epitaxy step, epitaxy regions 42/44 may be further implanted with a p-type or an n-type impurity to form source and drain regions, which are also denoted using reference numeral 42/44. In accordance with alternative embodiments of the present disclosure, the implantation step is skipped when epitaxy regions 42/44 are in-situ doped with the p-type or n-type impurity during the epitaxy. Epitaxy source/drain regions 42/44 include lower portions that are formed in STI regions 22, and upper portions that are formed over the top surfaces of STI regions 22.

Figure 6A:
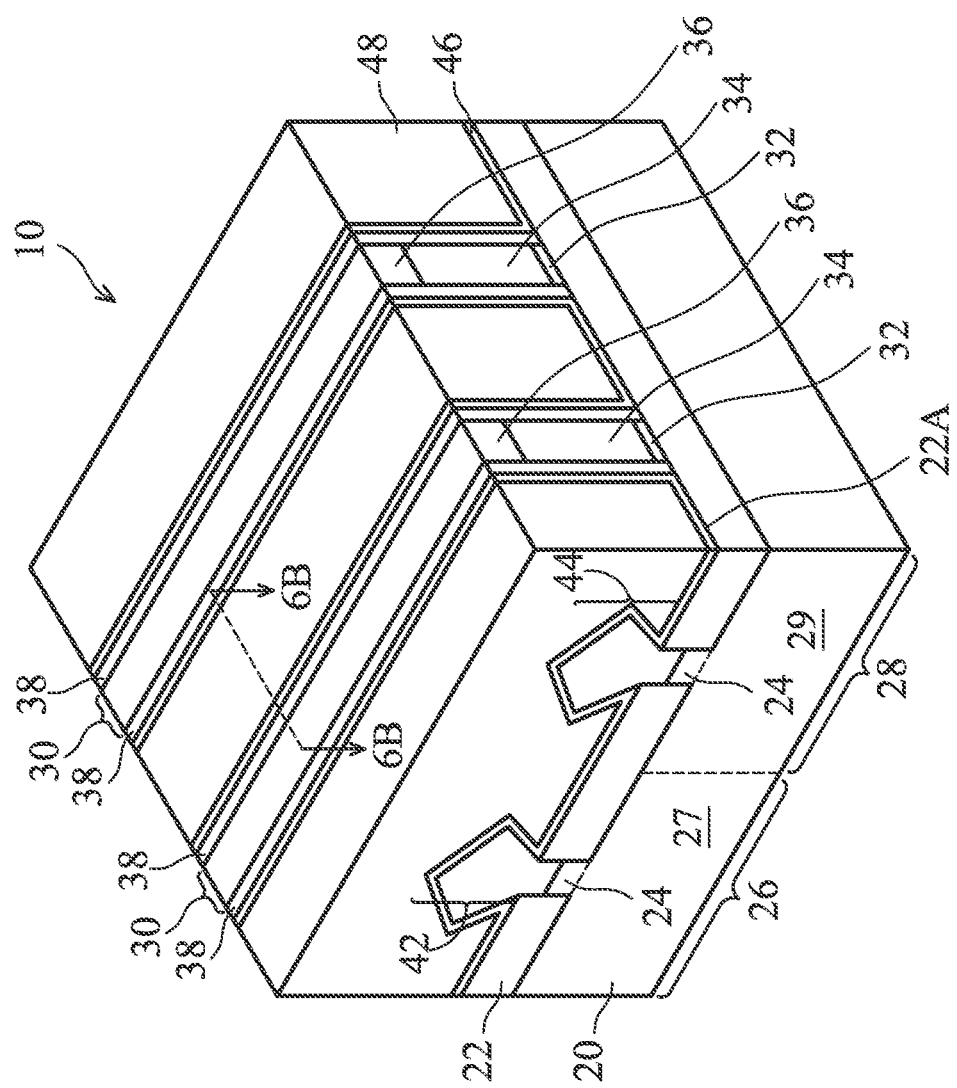

FIG. 6A illustrates a perspective view of the structure after the formation of Contact Etch Stop Layer (CESL) 46 and Inter-Layer Dielectric (ILD) 48. The respective process is illustrated as process 218 in the process flow 200 as shown in FIG. 30. CESL 46 may be formed of silicon oxide, silicon nitride, silicon carbo-nitride, or the like. CESL 46 may be formed using a conformal deposition method such as ALD, CVD, PVD, or the like, for example. ILD 48 may include a dielectric material formed using, for example, FCVD, spin-on coating, CVD, or another deposition method. ILD 48 may also be formed of an oxygen-containing dielectric material, which may be a silicon-oxide based dielectric such as Tetra Ethyl Ortho Silicate (TEOS) oxide, Plasma-Enhanced CVD (PECVD) oxide (including $SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 48, dummy gate stacks 30, and gate spacers 38 with each other.

Figure 6B:
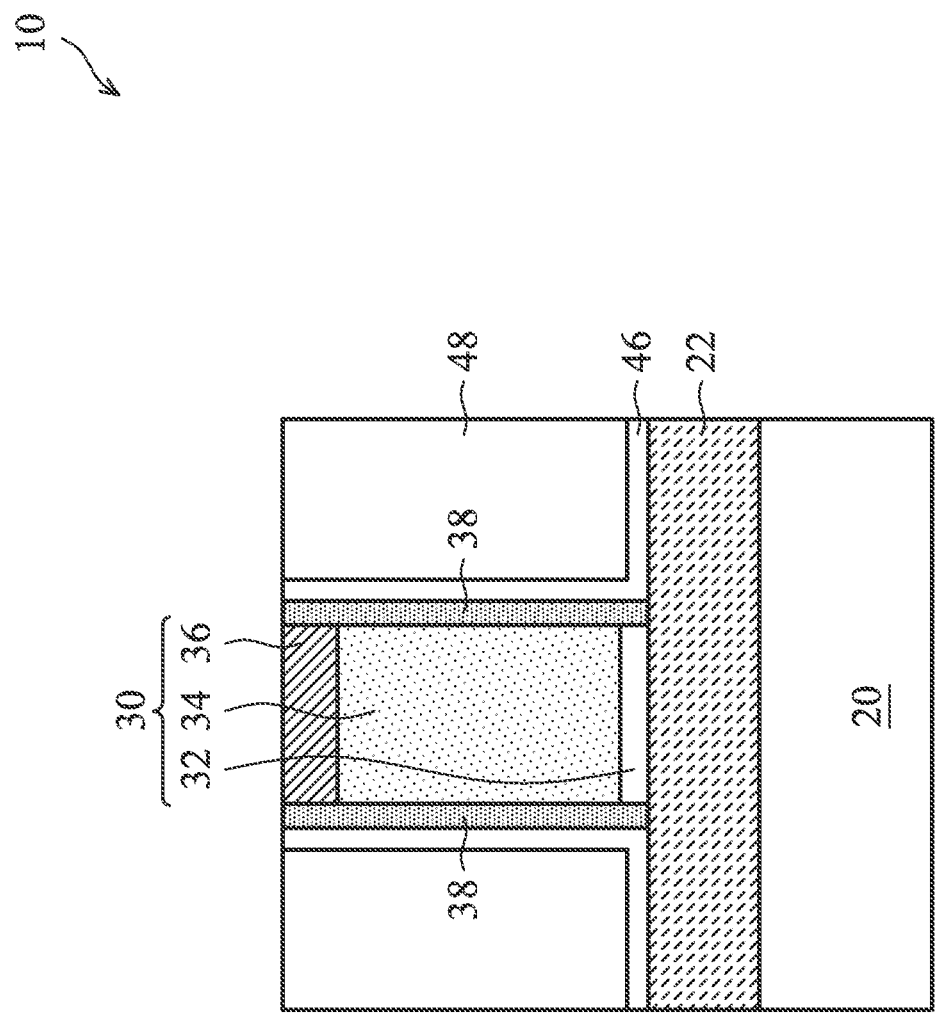

A cross-sectional view of the structure shown in FIG. 6A is illustrated in FIG. 6B. The cross-sectional view is obtained from the vertical plane containing line 6B-6B in FIG. 6A. As shown in FIG. 6B, one of dummy gate stacks 30 is illustrated.

Figure 7A:
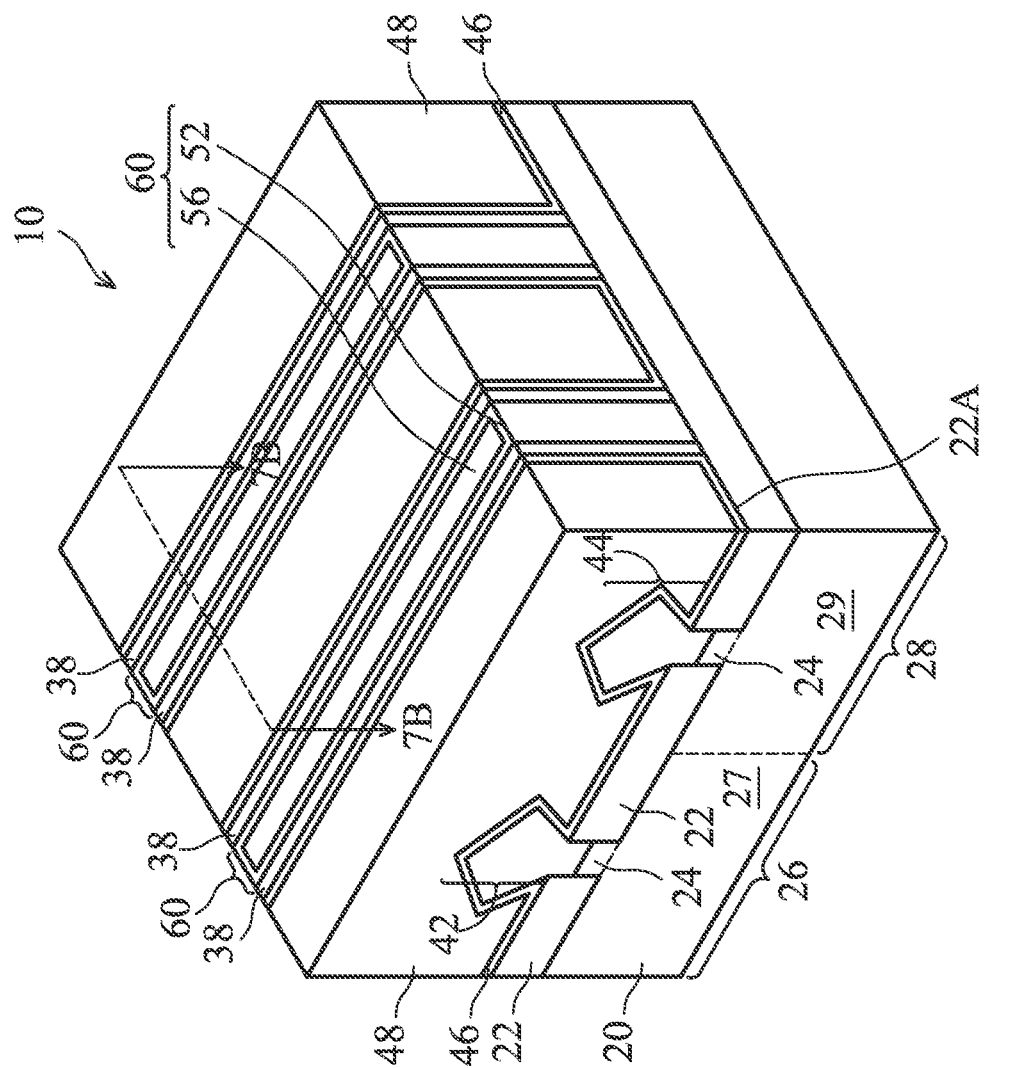
Figure 7B:
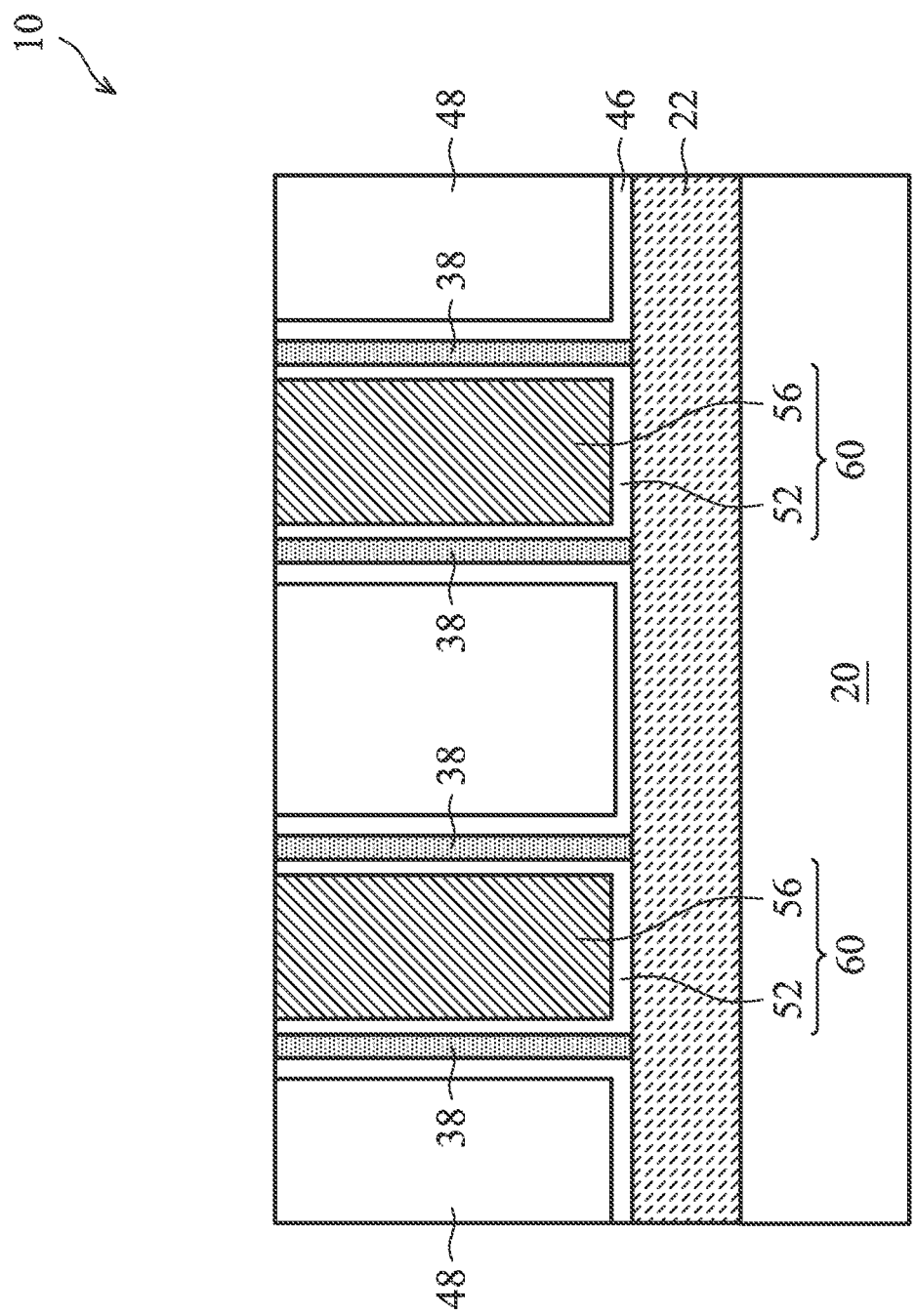

Next, dummy gate stacks 30, which include hard mask layers 36, dummy gate electrodes 34 and dummy gate dielectrics 32, are replaced with replacement gate stacks. The replacement gate stacks include metal gates and replacement gate dielectrics as shown in FIGS. 7A and 7B. FIG. 7B illustrates a cross-sectional view, which is obtained from the vertical plane containing line 7B-7B in FIG. 7A. In accordance with some embodiments of the present disclosure, the replacement process includes etching hard mask layers 36, dummy gate electrodes 34, and dummy gate dielectrics 32 as shown in FIGS. 6A and 6B in one or a plurality of etching steps, resulting in openings to be formed between opposite portions of gate spacers 38.

Next, referring to FIGS. 7A and 7B, (replacement) gate stacks 60 are formed, which include gate dielectric layers 52 and gate electrodes 56. The respective process is illustrated as process 220 in the process flow 200 as shown in FIG. 30. FIG. 7B illustrates the cross-sectional view of gate stack 60. The cross-sectional view is obtained from the vertical plane containing line 7B-7B as shown in FIG. 7A. The formation of gate stacks 60 includes forming/depositing a plurality of layers, and then performing a planarization process such as a CMP process or a mechanical grinding process. Gate dielectric layers 52 extend into the trenches left by the removed dummy gate stacks. In accordance with some embodiments of the present disclosure, each of gate dielectric layers 52 includes an Interfacial Layer (IL, not shown) as its lower part. The ILs are formed on the exposed surfaces of protruding fins 24'. Each of the ILs may include an oxide layer such as a silicon oxide layer, which is formed through the thermal oxidation of protruding fins 24', a chemical oxidation process, or a deposition process. In some embodiments, portions of the dummy gate dielectrics 32 remain after removing the dummy gate stacks 30, and these remaining portions of the dummy gate dielectrics 32 may be used as the ILs.

Gate dielectric layer 52 may also include a high-k dielectric layer formed over the IL. The high-k dielectric layer may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD, CVD, or the like.

Referring back to FIGS. 7A and 7B, gate electrodes 56 are formed on the top of gate dielectric layers 52, and fill the remaining portions of the trenches left by the removed dummy gate stacks. The sub-layers in gate electrodes 56 are not shown separately in FIG. 7A, while in reality, the sub-layers are distinguishable from each other due to the difference in their compositions. The deposition of at least lower sub-layers may be performed using conformal deposition methods such as ALD, CVD, PVD, or the like so that the thickness of the vertical portions and the thickness of the horizontal portions of gate electrodes 56 (and each of sub-layers) are substantially equal to each other.

Gate electrodes 56 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other, so that the work functions of the metal layers are suitable for the respective p-type or n-type FinFETs. The filling metal may include aluminum, tungsten, cobalt, or the like.

Figure 8A:
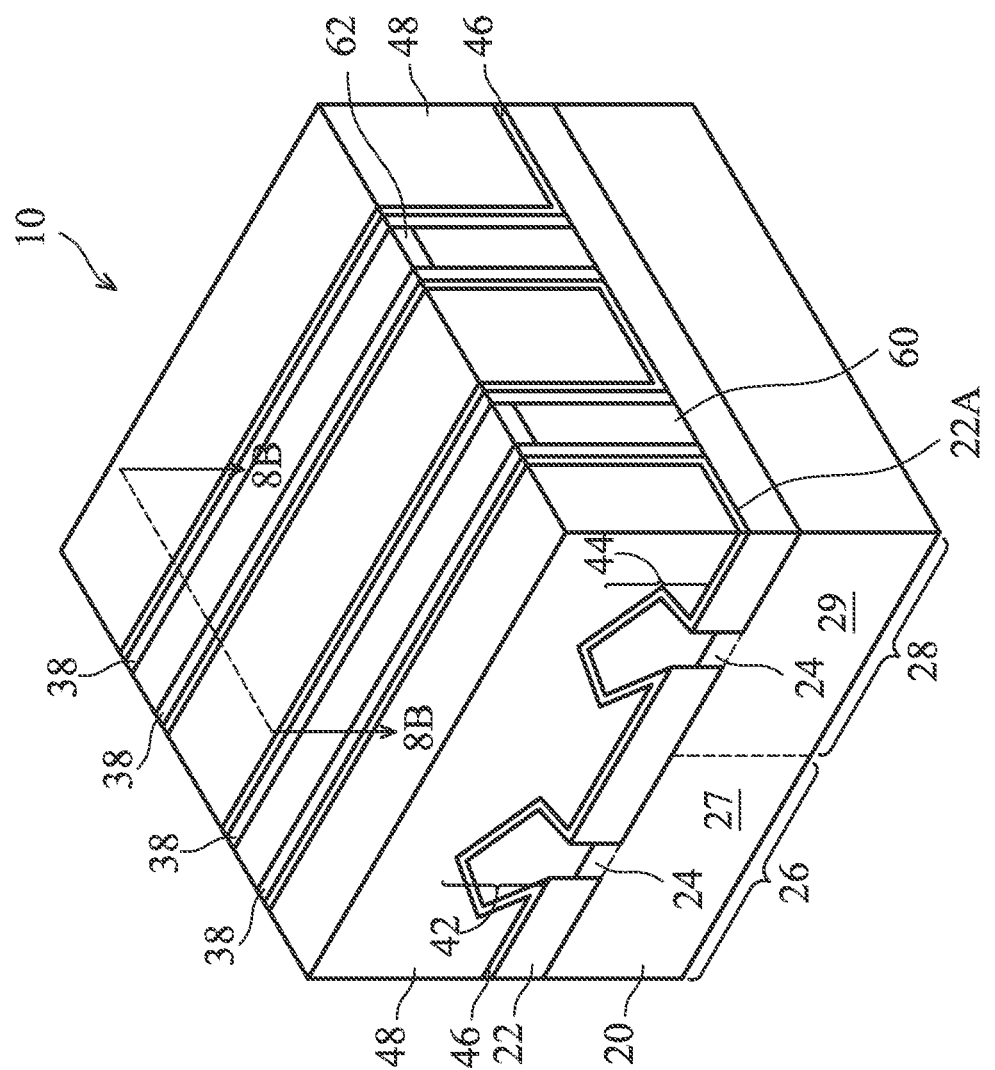
Figure 8B:
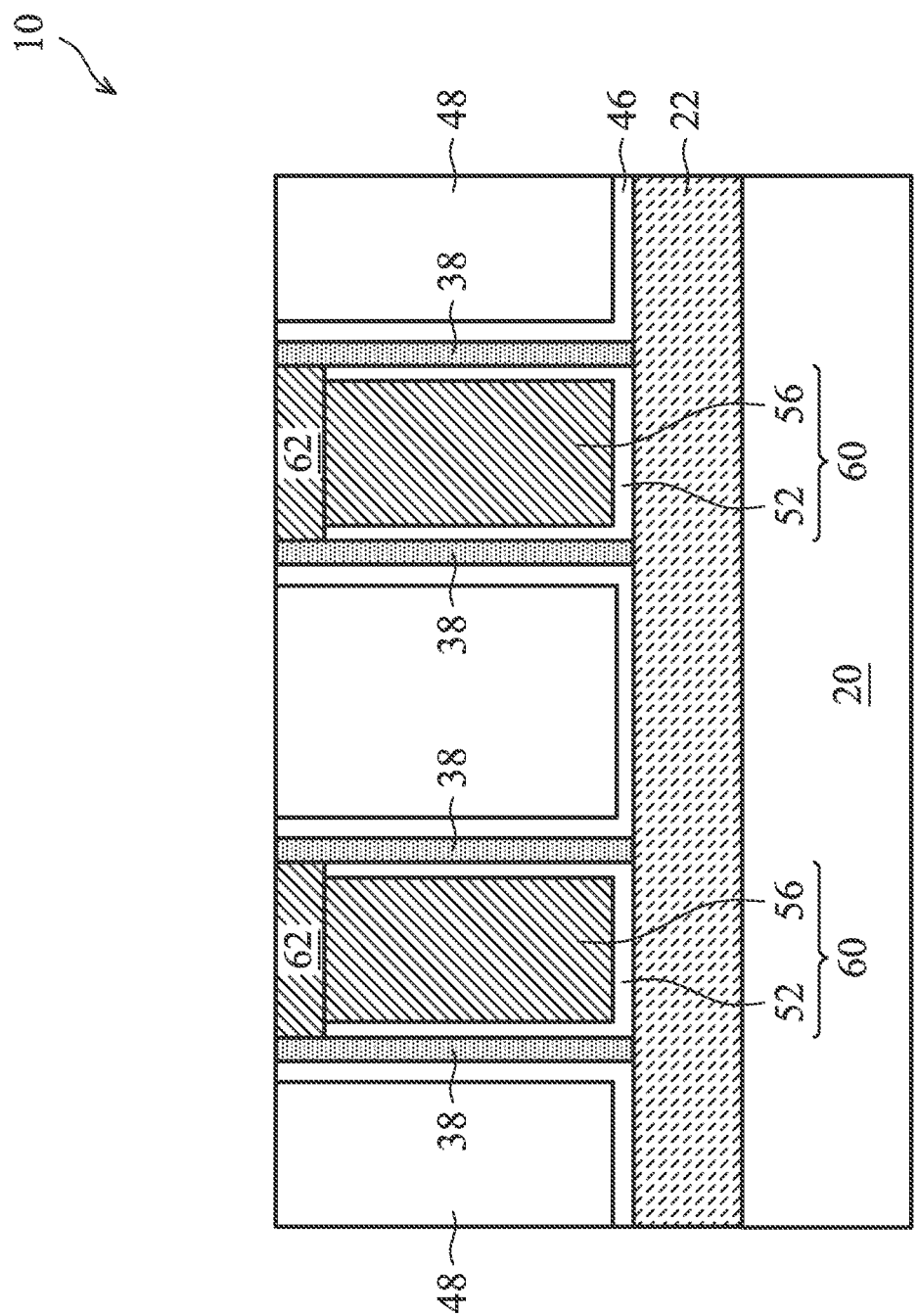

Next, as shown in FIGS. 8A and 8B, hard masks 62 are formed. The material of hard masks 62 may be the same as or different from the materials of some of CESL 46, ILD 48, and/or gate spacers 38. In accordance with some embodiments, hard masks 62 are formed of silicon nitride, silicon oxynitride, silicon oxy-carbide, silicon oxy carbo-nitride, or the like. The formation of hard masks 62 may include recessing replacement gate stacks 60 through etching to form recesses, filling a dielectric material into the recesses, and performing a planarization to remove the excess portions of the dielectric material. The remaining portions of the dielectric material are hard masks 62. FIG. 8B illustrates a cross-sectional view of the structure shown in FIG. 8A, with the cross-sectional view obtained from the plane containing line 8B-8B in FIG. 8A.

FIGS. 9, 10A, 10B, 10C, 11A, 11B, 11C, 12A, 12B, 13A, 13B, 14, 15A and 15B illustrate a cut-metal gate process. The figure numbers of the subsequent processes may include the letter "A," "B," or "C." Unless specified otherwise, the figures whose numbers having the letter "A" are obtained from the vertical plane same as the vertical plane containing line A-A in FIG. 9. The figures whose numbers having the letter "B" are obtained from the vertical plane same as the vertical plane containing line B-B in FIG. 9. The figures whose numbers having the letter "C" are obtained from the vertical plane same as the vertical plane containing line C-C in FIG. 9.

Figure 10A:
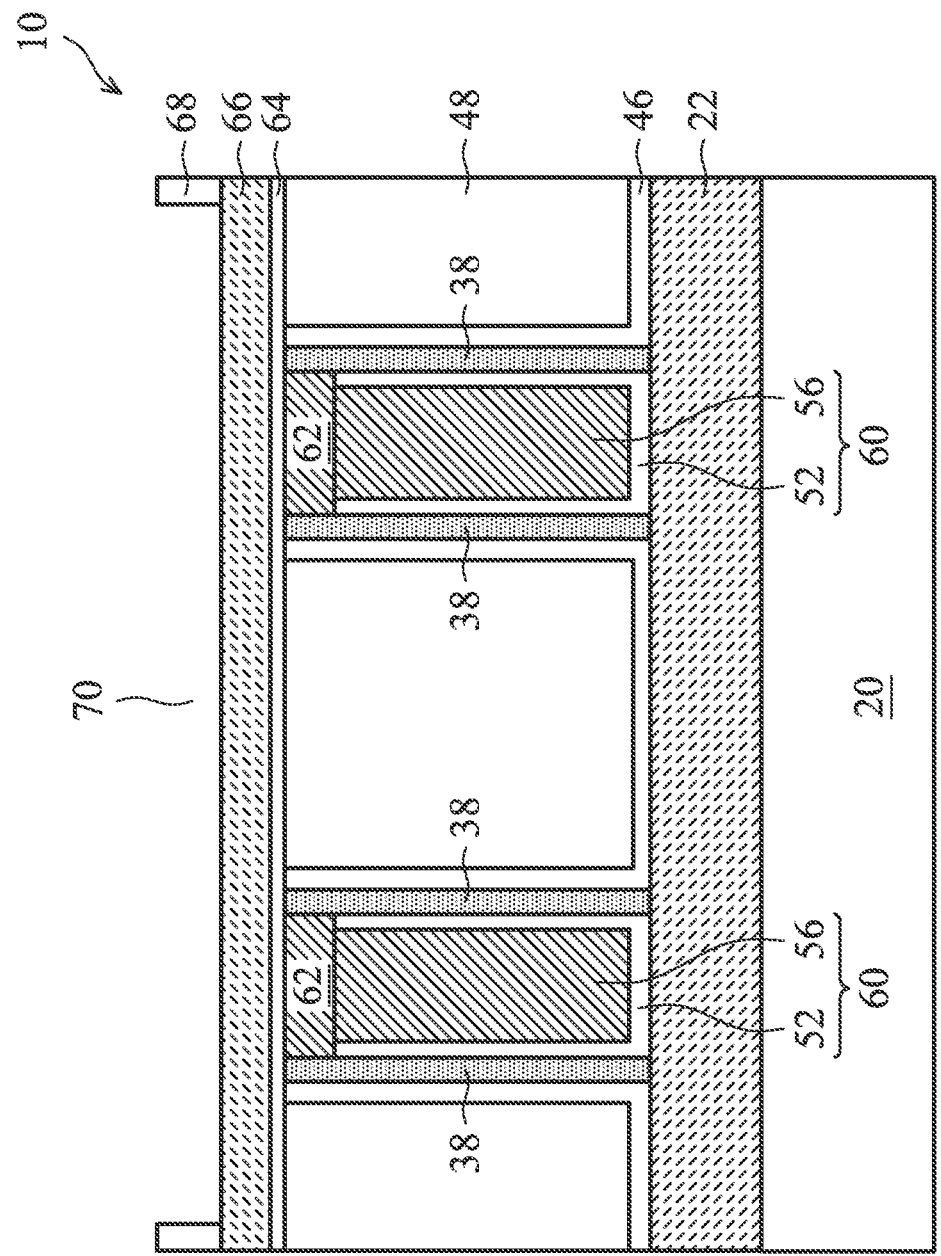
Figure 10B:
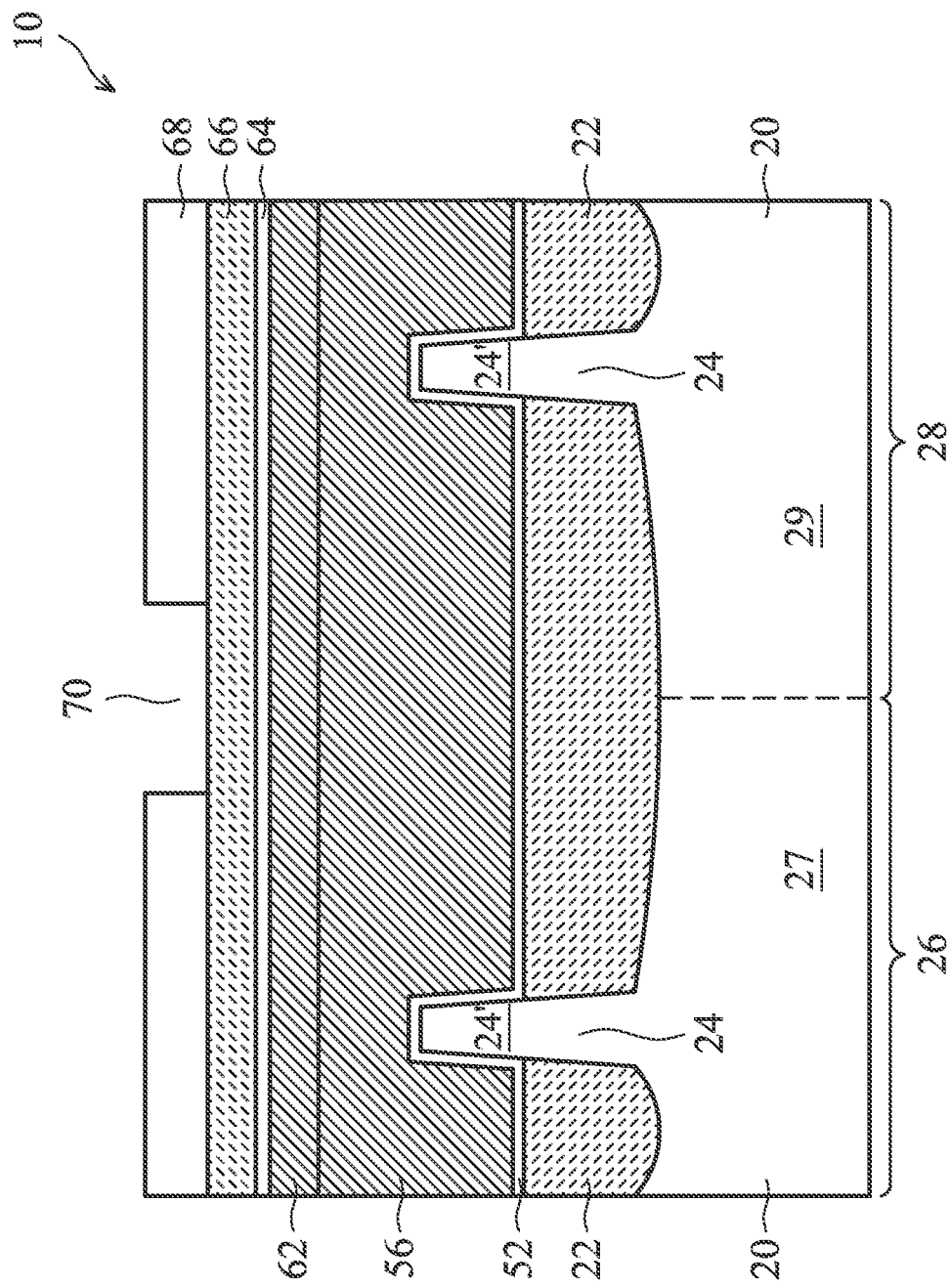
Figure 10C:
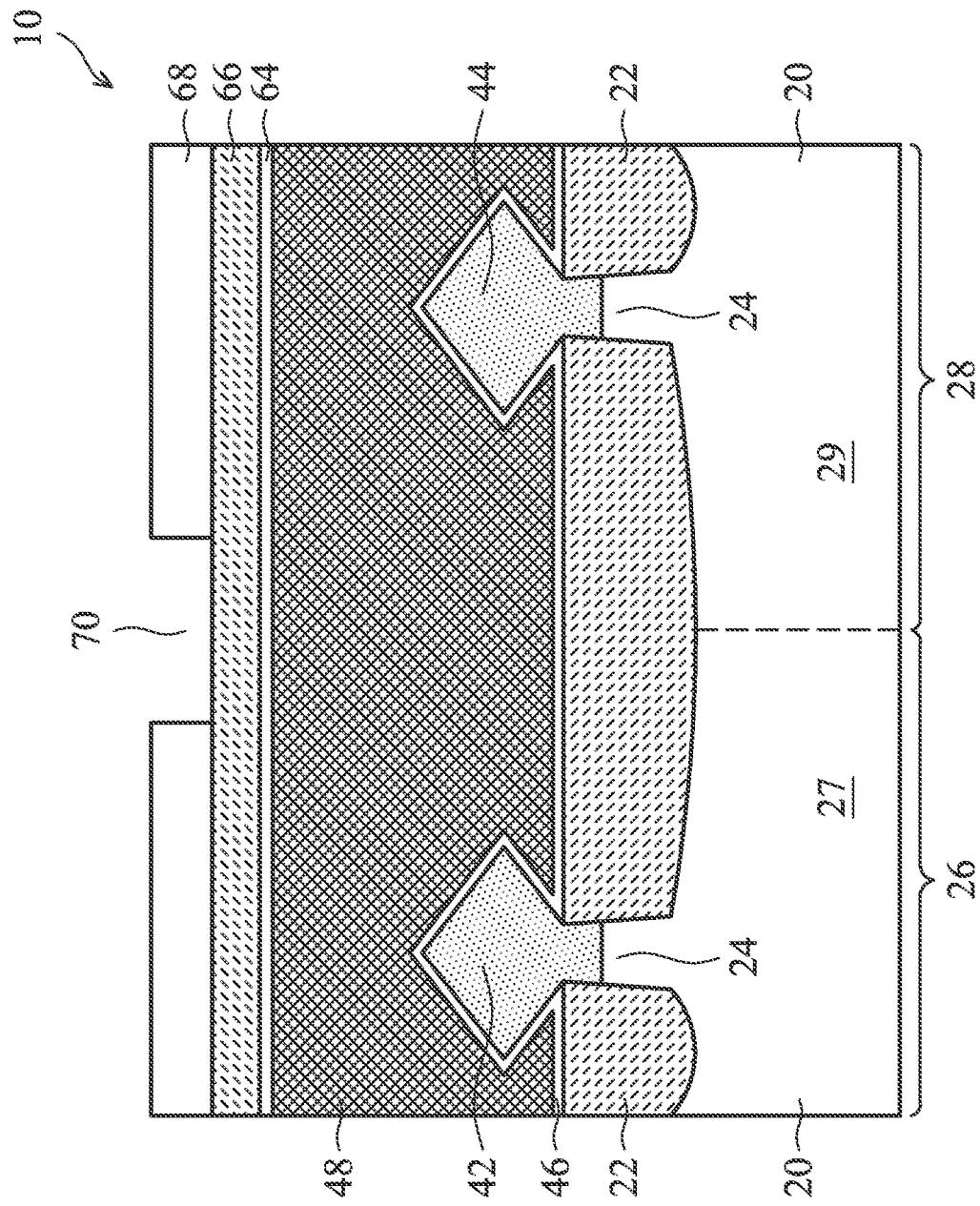

FIGS. 9, 10A, 10B, and 10C illustrate the formation of pad layer 64, hard mask layer 66, and patterned photo resist 68. A Bottom Anti-Reflective Coating (BARC, not shown) may also be formed between hard mask layer 66 and the patterned photo resist 68. FIGS. 10A, 10B, and 10C illustrate the cross-sectional views obtained from the vertical planes containing line A-A, B-B, and C-C, respectively, in FIG. 9. In accordance with some embodiments, pad layer 64 is formed of a metal-containing material such as TiN, TaN, or the like. Pad layer 64 may also be formed of a dielectric material such as silicon oxide. Hard mask layer 66 may be formed of SiN, SiON, SiCN, SiOCN, or the like. The formation may include ALD, PECVD, or the like. Photo resist 68 is coated over hard mask layer 66, and opening 70 is formed in photo resist 68. Opening 70 has a lengthwise direction (viewed from top) perpendicular to the lengthwise direction of the replacement gate stack 60, and replacement gate stacks 60 and a portion of ILD 48 are directly underlying a portion of opening 70, as illustrated in FIGS. 9, 10A, 10B and 10C.

Figure 11A:
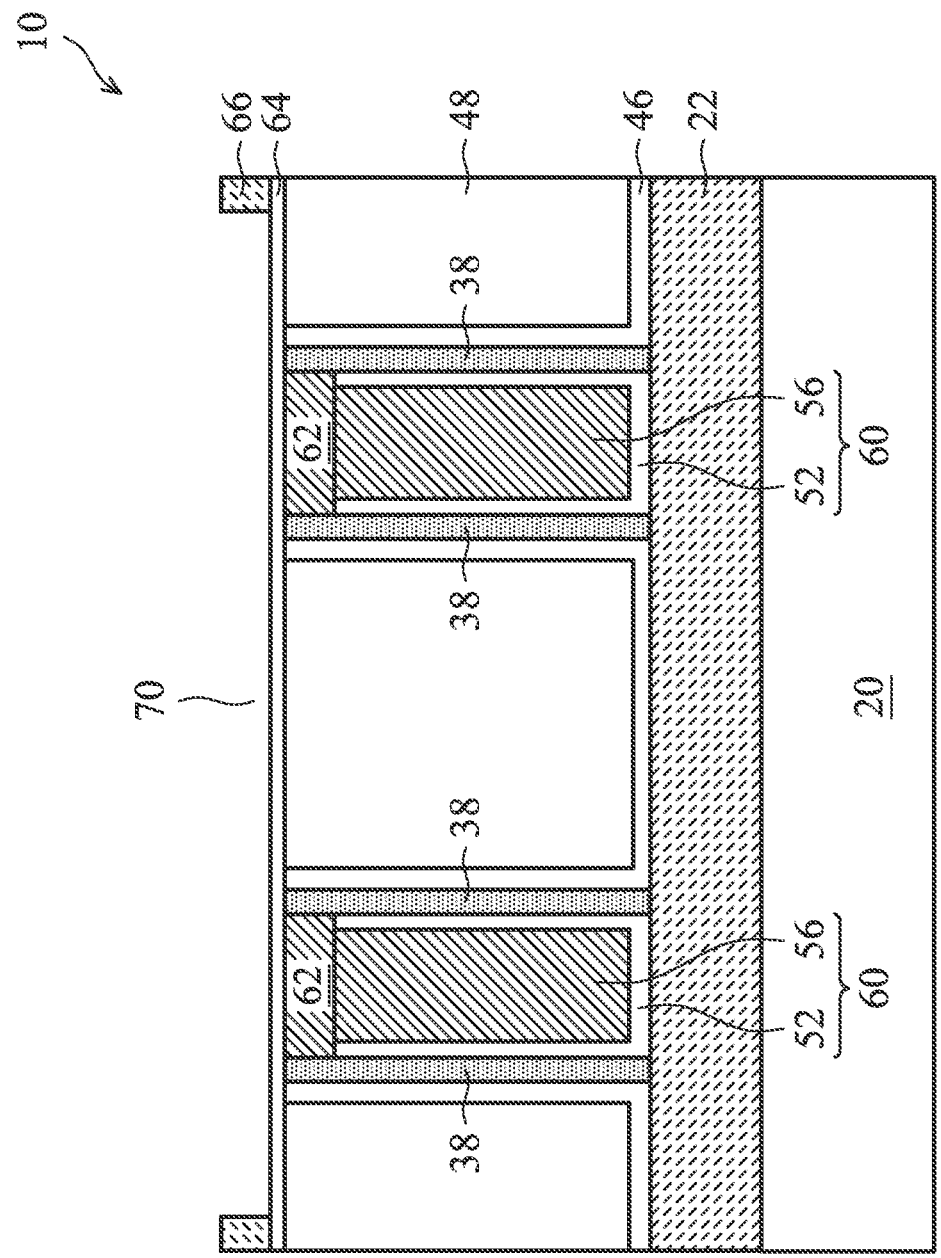
Figure 11B:
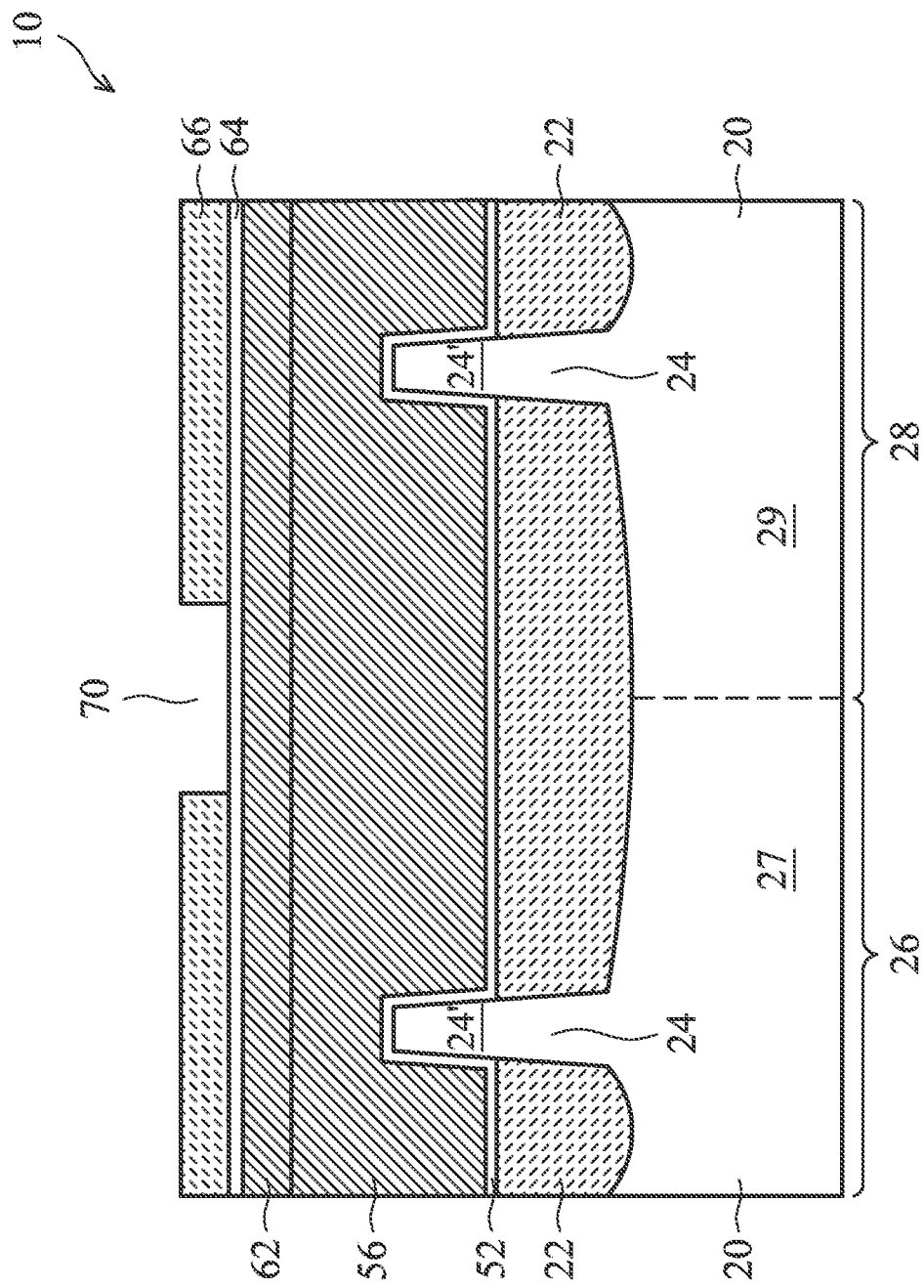
Figure 11C:
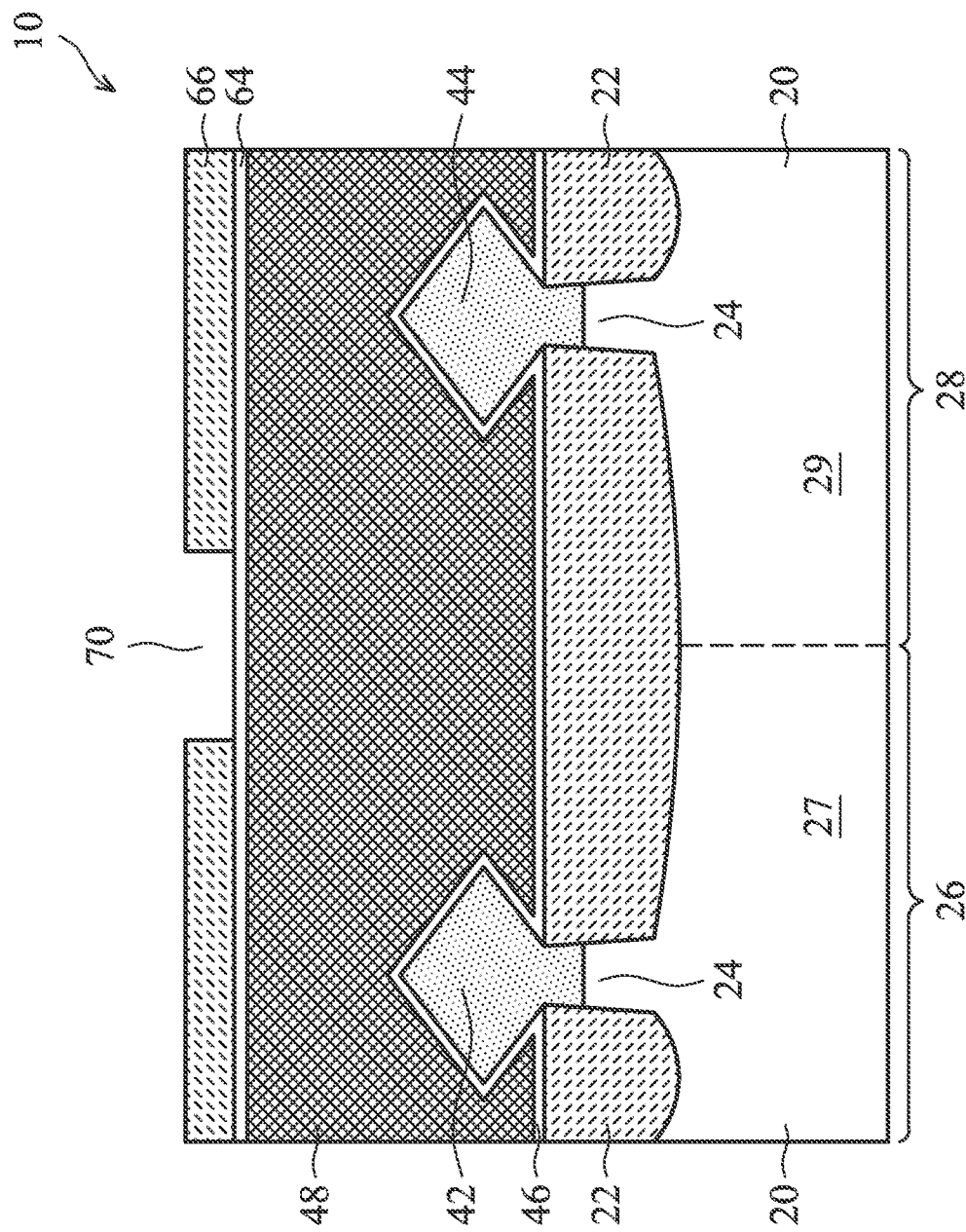

FIGS. 11A, 11B, and 11C illustrate the etching of hard mask layer 66, in which the patterned photo resist 68 (FIGS. 10A, 10B, and 10C) is used as an etching mask. Opening 70 thus extends into hard mask layer 66. The respective process is illustrated as process 222 in the process flow 200 as shown in FIG. 30. The top surface of pad layer 64 is thus exposed to opening 70. Photo resist 68 is then removed.

Figure 12A:
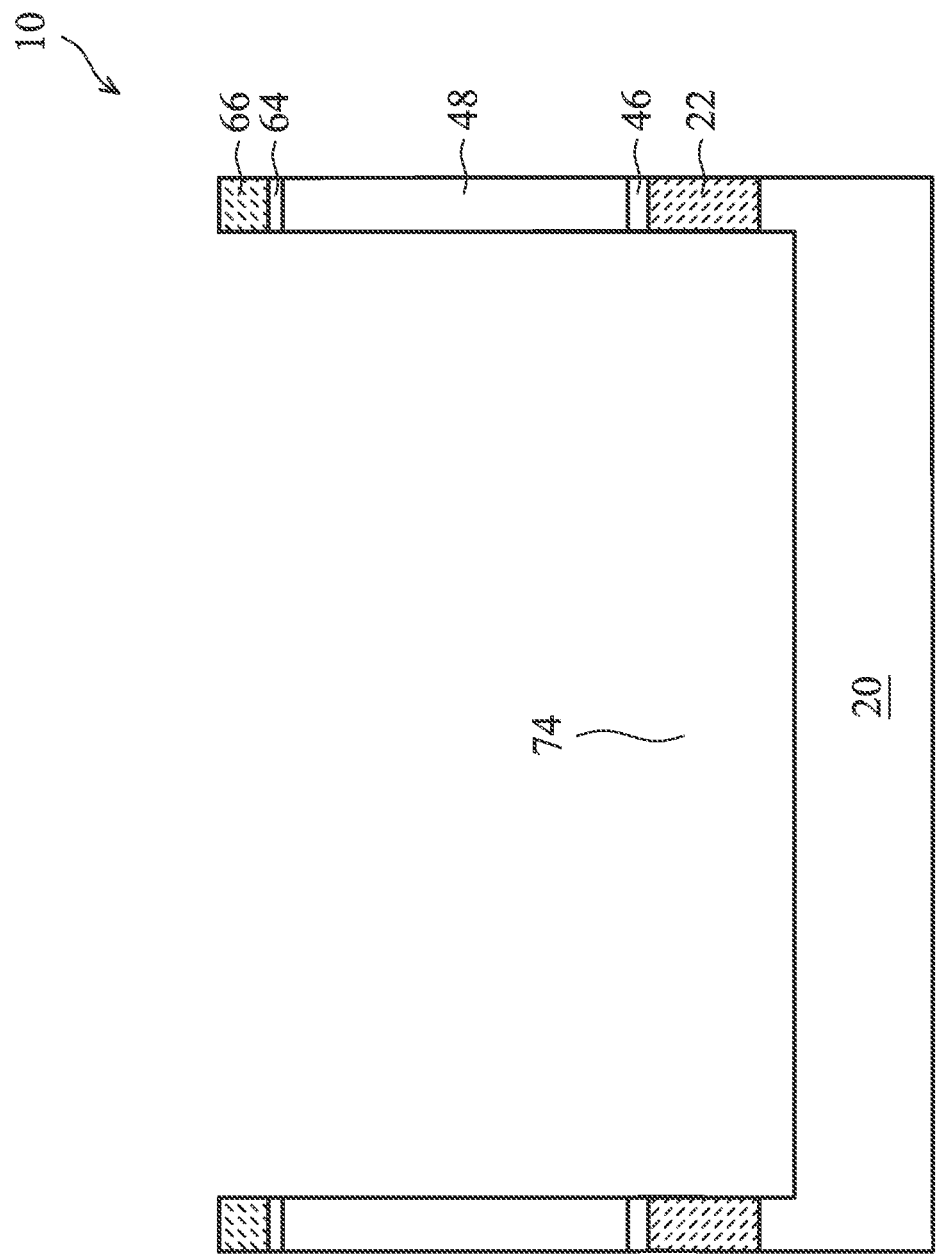
Figure 12B:
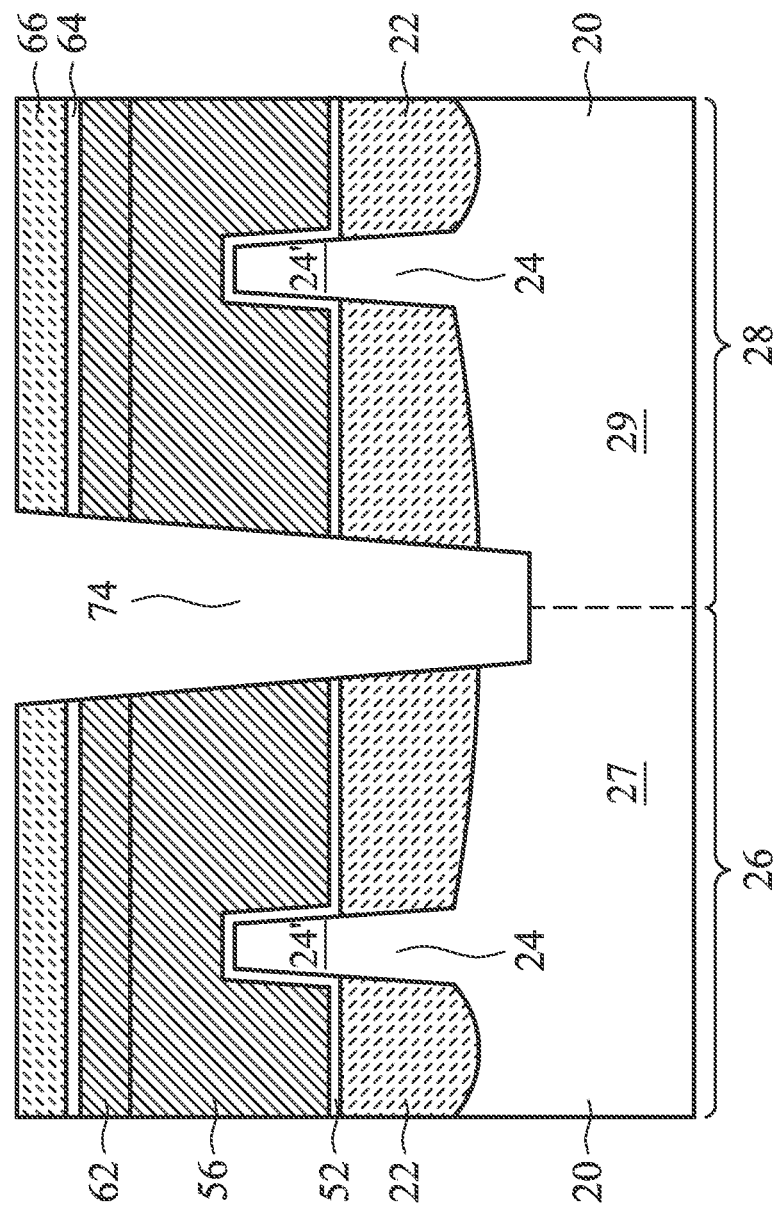

FIGS. 12A and 12B illustrate the formation of trench 74 in accordance with some embodiments. The respective process is illustrated as process 224 in the process 200 as shown in FIG. 30. In accordance with some embodiments of the present disclosure, pad layer 64 and the underlying hard masks 62 and gate electrodes 56 are etched to form trench 74, which extends to an intermediate level of gate electrode 56. Gate spacers 38 and the exposed portions of ILD 48 are also etched. In accordance with some embodiments of the present disclosure, the etching is performed using process gases selected from, and not limited to, $Cl_2$, $BCl_3$, Ar, $CH_4$, $CF_4$, and combinations thereof. Next, trench 74 is extended by use of another etching process. The etching is performed using an appropriate etching gas, depending on the material of the etched portion of gate electrode 56. In accordance with some embodiments, during the etching process, a polymer such as $C_xH_y$ may be formed (with X and Y being integers) at the bottom of opening. The polymer may then be removed, for example, using oxygen ($O_2$). In accordance with some embodiments, the etching results in trench 74 to extend further down, until gate electrode 56, gate dielectric 52 and STI region 22 are etched through, and trench 74 extends into both region 26 and region 28 of the bulk portion of substrate 20 directly under STI region 22. For example, trench 74 is located at a boundary between regions 26 and 28, and trench 27 exposes n-well 27 and p-well 29.

Figure 13A:
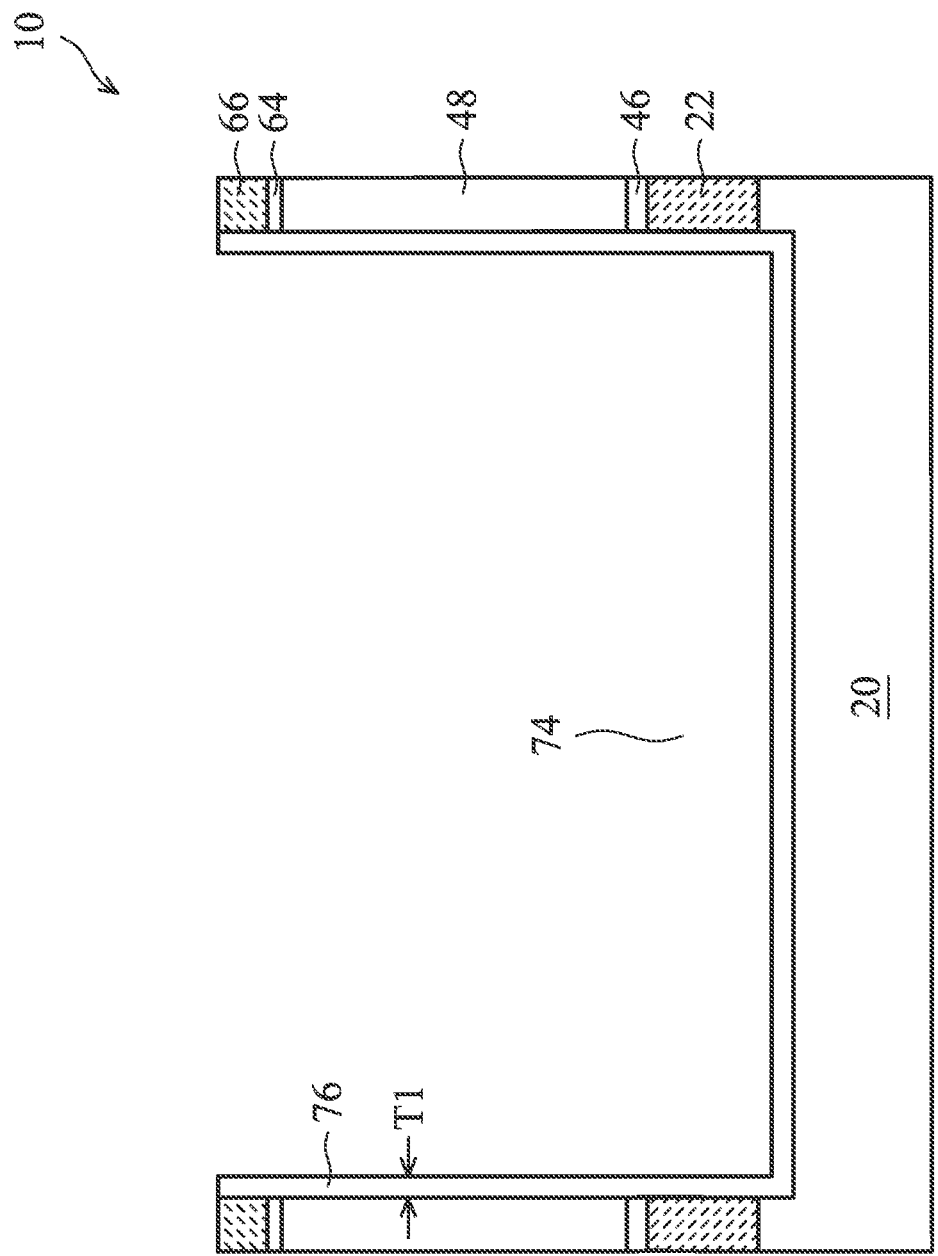
Figure 13B:
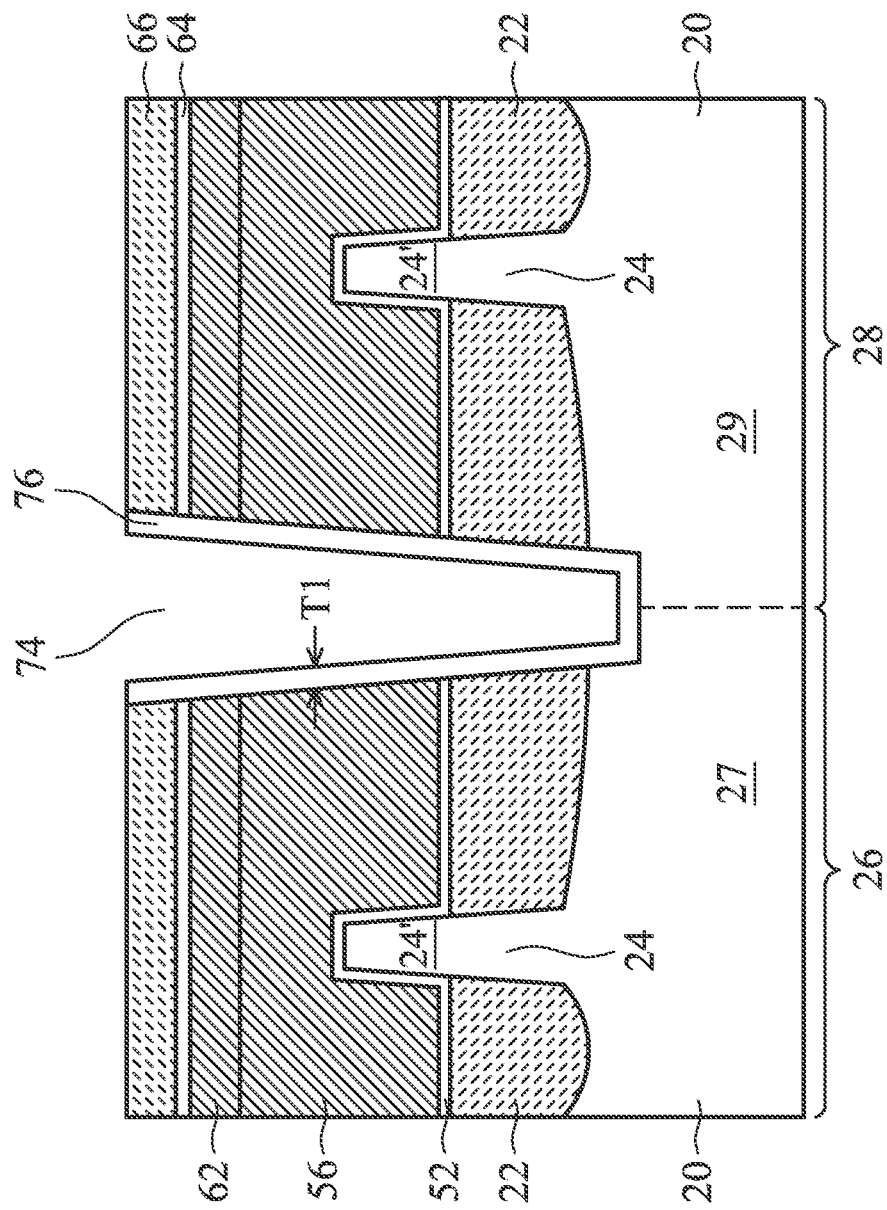

Next, in FIGS. 13A and 13B, a dielectric liner 76 is formed in the trench 74. The respective process is illustrated as process 226 in the process 200 as shown in FIG. 30. In some embodiments, the dielectric liner 76 comprises silicon nitride, silicon oxide, silicon oxynitride, or the like, and may be formed by an ALD, CVD, or the like process. The thickness T1 of the dielectric liner 76 may be in a range of about lnm to about 5 nm. Dielectric liner 76 is in physical contact with ILD 48, CESL 46, STI region 22, and substrate 20. It has been observed that when dielectric liner 76 has the above thickness T1, advantages can be achieved. For example, when dielectric liner 76 is thinner than about lnm, insufficient isolation is provided by the dielectric liner 76, and a subsequently formed contact 82 (see FIG. 14) is not sufficiently isolated from the gate stack 60A and the gate stack 60B (see FIG. 16) and may electrically short the gate stack 60A and the gate stack 60B. As another example, when dielectric liner 76 is thicker than about 5 nm, an inefficiently high voltage has to be applied to the subsequently formed contact 82 (see FIG. 14) in the STI to be able to control the potential profile at the bottom of the STI region 22.

Figure 14:
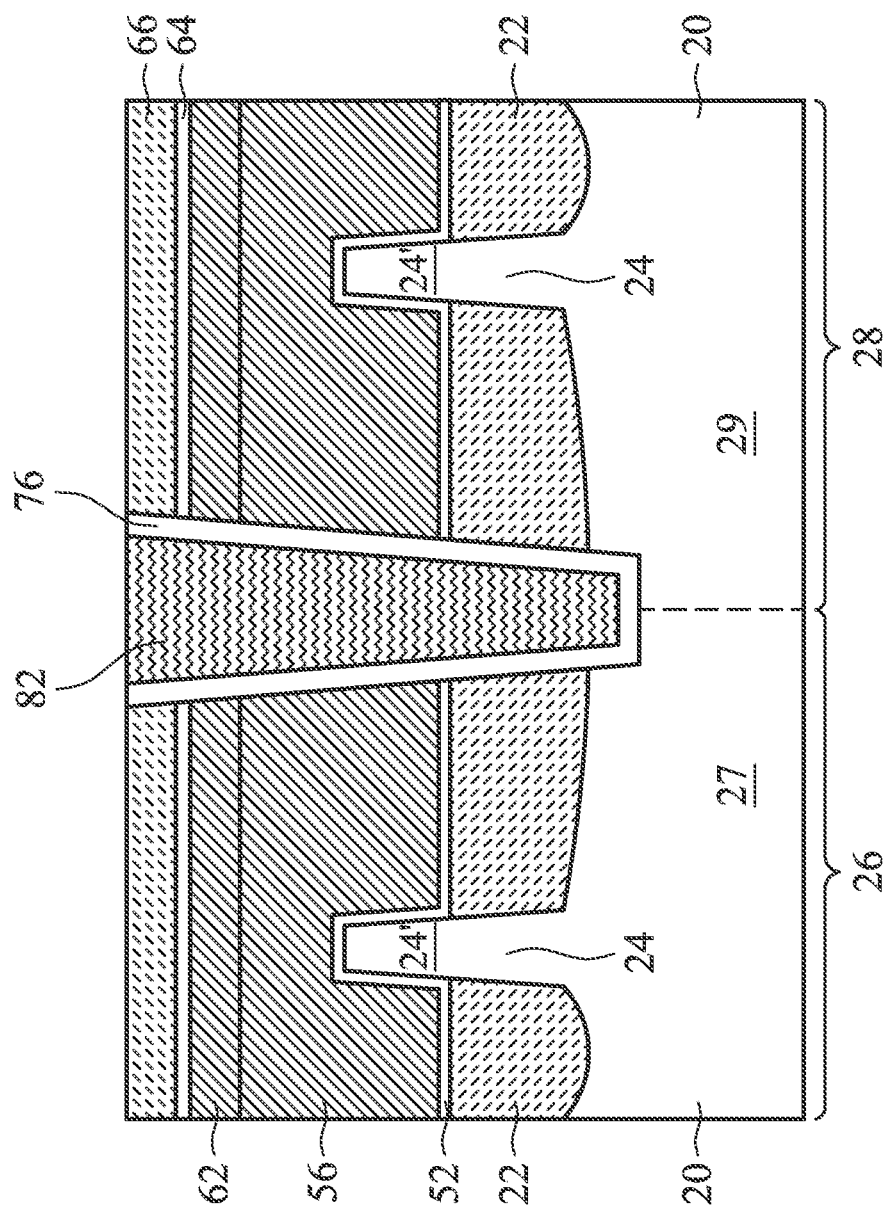
Figure 21:
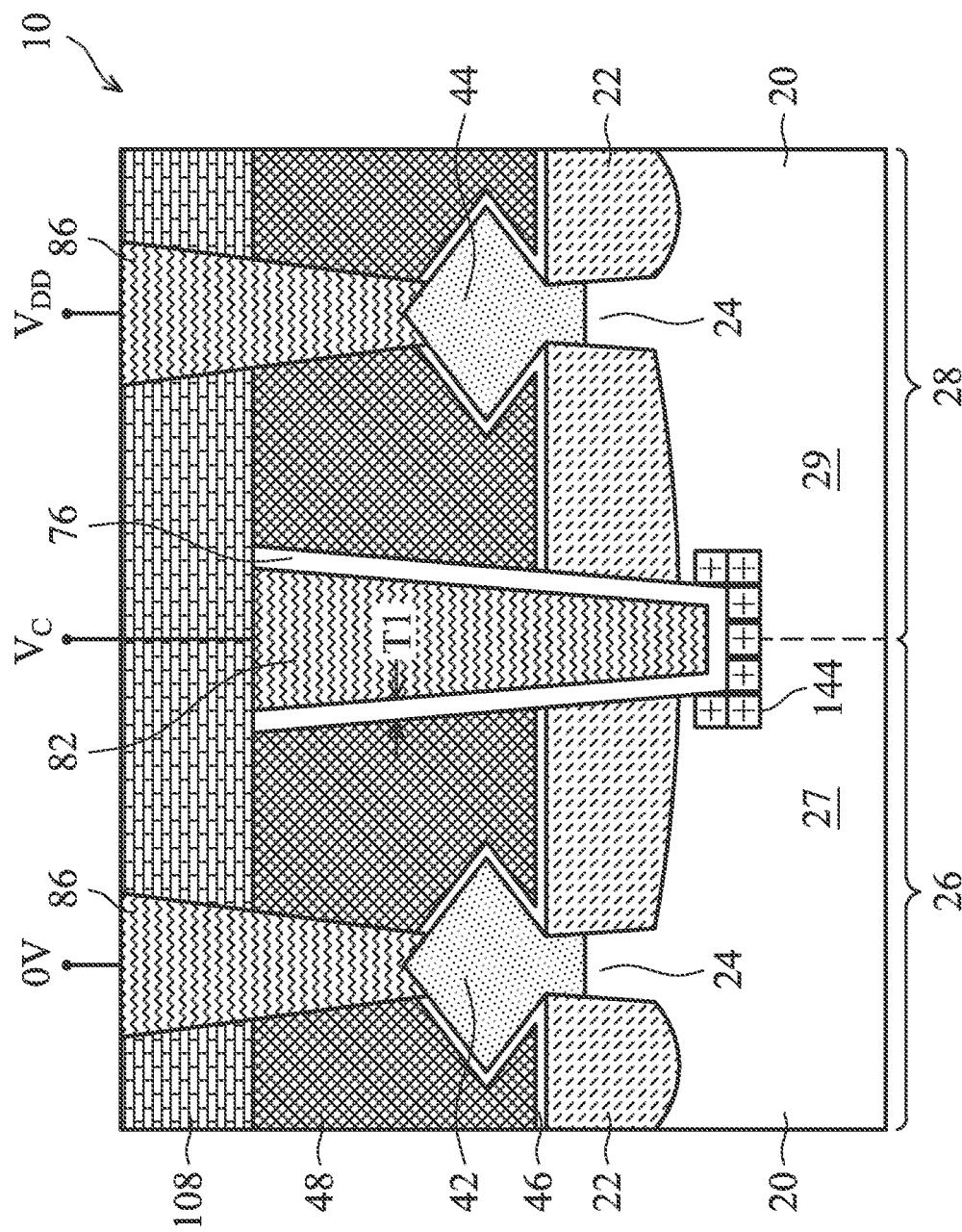
FIGS. 21 and 22 illustrate the FinFETs referenced in FIG. 19C where the epitaxy regions are biased at $V_{DD}$.

FIG. 14 illustrates the formation of a contact 82 and is obtained from the same vertical plane as the vertical plane containing line B-B in FIG. 9. The respective process is illustrated as process 228 in the process flow 200 as shown in FIG. 21. The formation of contact 82 may include filling trench 74 with a conductive material which may be copper, a copper alloy, silver, gold, tungsten, cobalt, aluminum, nickel, ruthenium, or the like. The contact 82 extends below a bottommost surface of the STI region 22. The contact 82 has a first bottom portion in n-well 27 of region 26 of substrate 20 and a second bottom portion in the p-well 29 of region 28 of substrate 20, the center of the bottommost surface may be vertically aligned to an interface between the n-well 27 and the p-well 29 of substrate 20. (See FIG. 14). The Contact 82 extends along a lengthwise direction, which is parallel to the lengthwise direction of semiconductor strips 24.

Figure 15A:
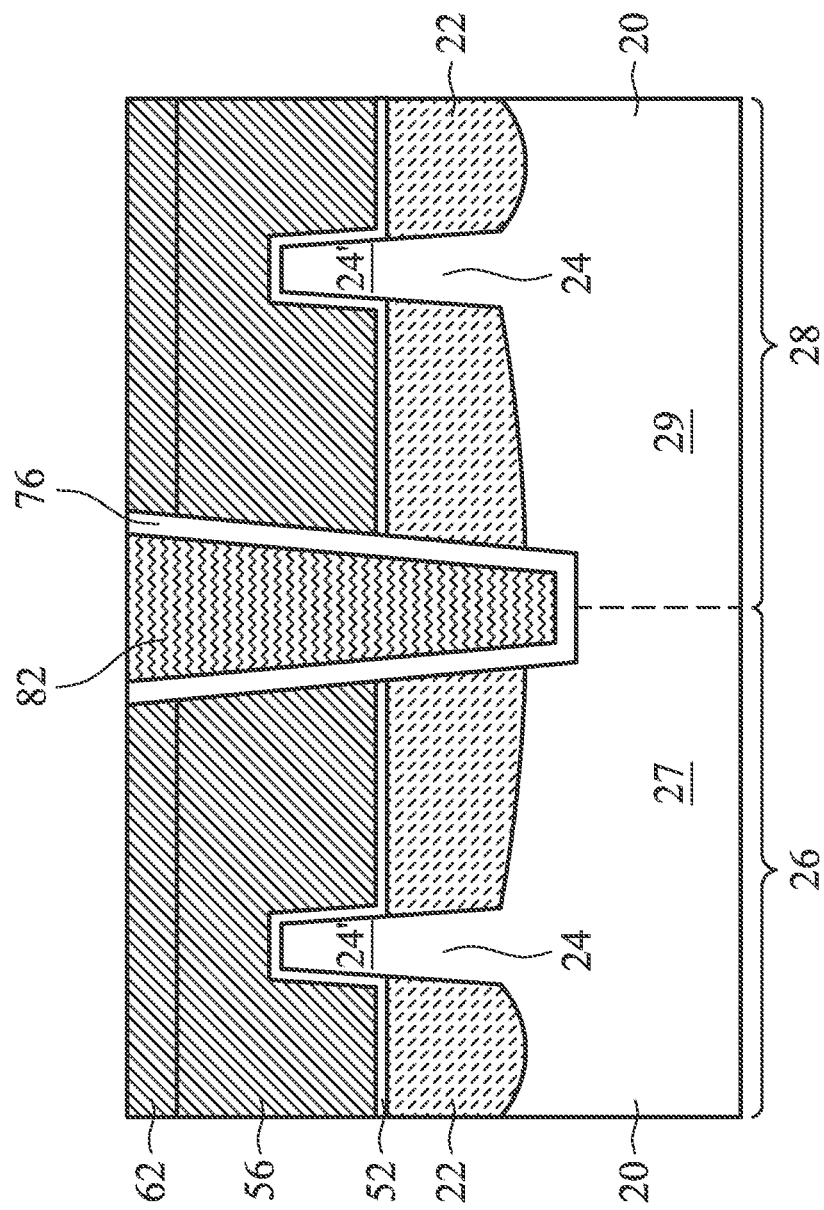
Figure 15B:
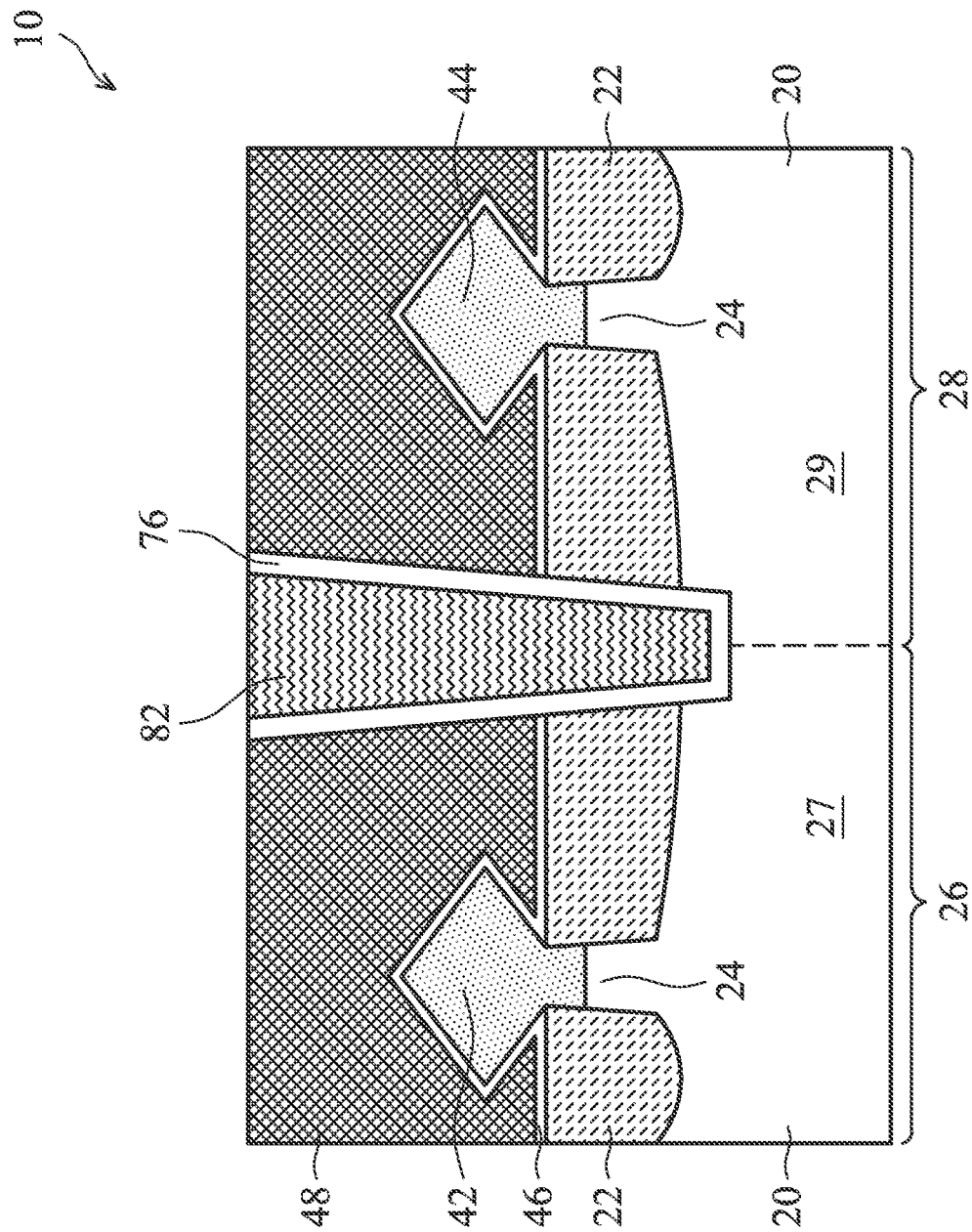

Next, in FIGS. 15A and 15B a planarization such as a CMP process or a mechanical grinding process to remove pad layer 64, hard mask layer 66 and the excess portions of the conductive material is performed. FIG. 15A is obtained from the same vertical plane as the vertical plane containing line B-B in FIG. 9, while FIG. 15B is obtained from the same vertical plane as the vertical plane containing line C-C in FIG. 9.

Figure 16:
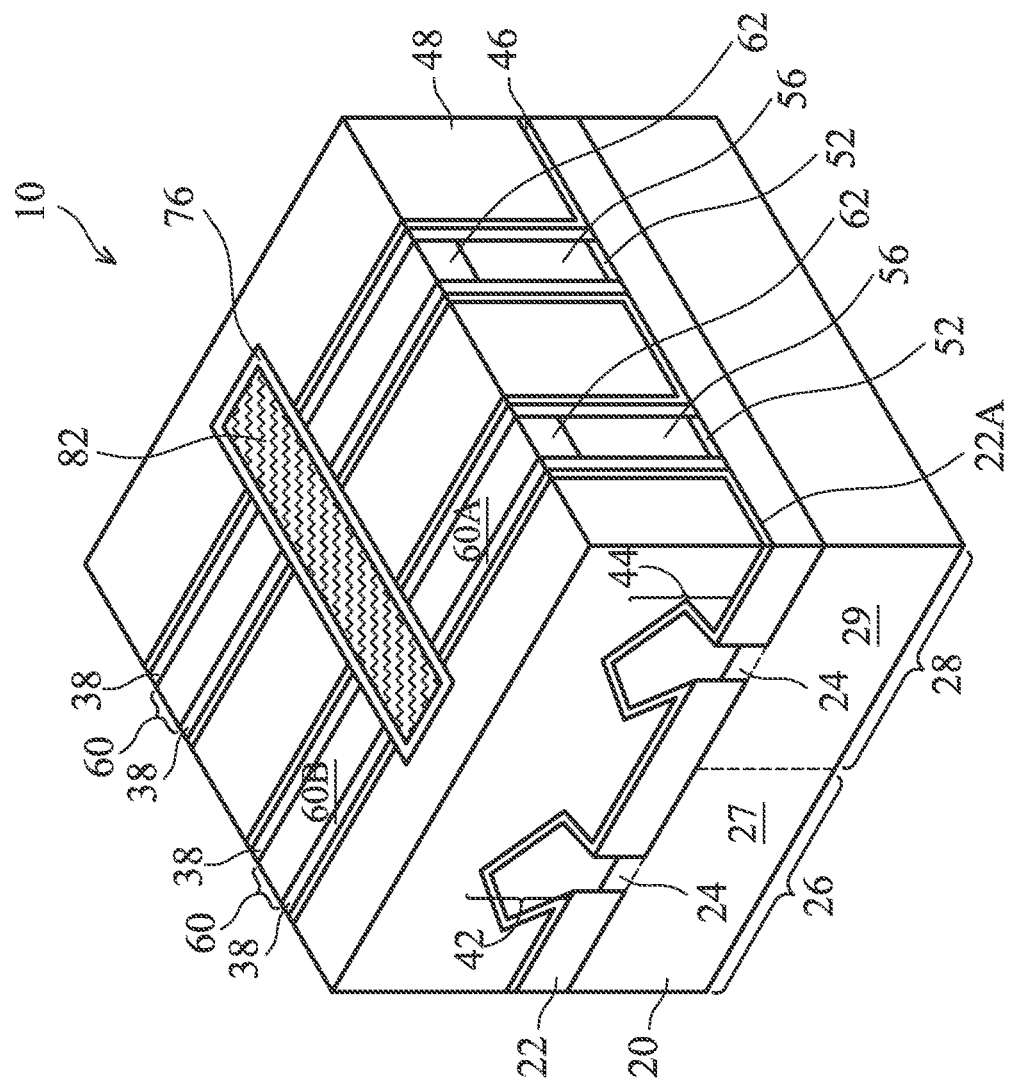

FIG. 16 illustrates a perspective view of wafer 10 and the contact 82, which cuts the otherwise continuous gate stacks 60, hard masks 62, and gate spacers 38 into separate portions. The separate portions provide a gate stack 60A for an nMOS transistor and a gate stack 60B for a pMOS transistor. The gate stack 60A is electrically isolated from the gate stack 60B by the dielectric liner 76. The dielectric liner 76 also electrically isolates the contact 82 from the gate stacks 60A and 60B.

Figure 17:
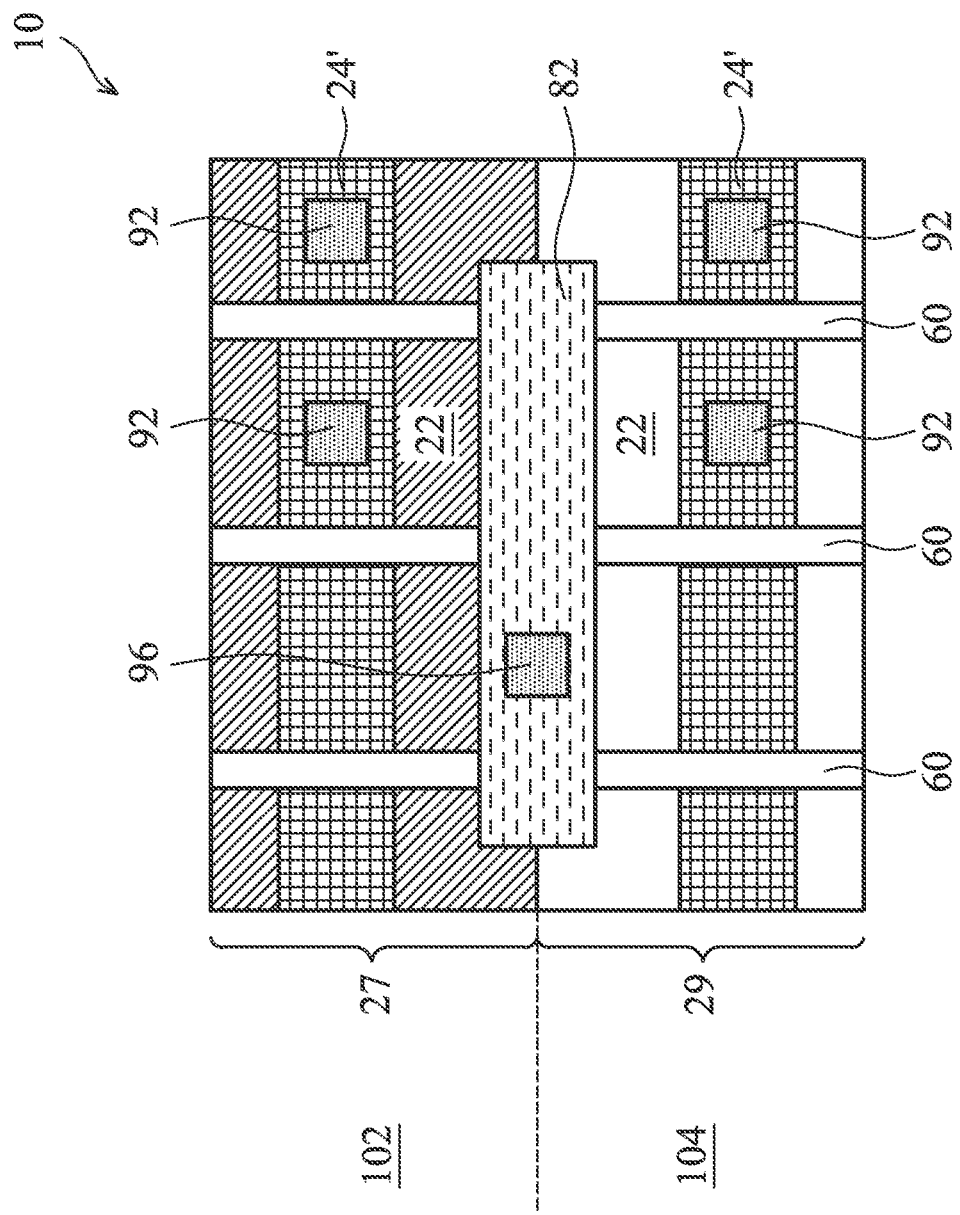
FIGS. 17 and 18 illustrate top-down views in accordance with embodiments of the present disclosure.

FIG. 17 illustrates a top-down view of the wafer 10 and the contact 82 in accordance with an example embodiment of the present disclosure. Wafer 10 has an n-well 27 on which a first circuit 102 is formed and a p-well 29 on which a second circuit 104 is formed, the first circuit 102 being independent of the second circuit 104. The first circuit 102 and the second circuit 104 are adjacent to each other and separated by an STI region 22. The first circuit 102 and the second circuit 104 each comprise a FinFET. The contact 82 extends vertically through the STI region 22 into the wells 27/29 below the STI, at the interface between the n-well 27 and the p-well 29. The contact 82 may extend between and physically isolate gate stacks 60A of the first circuit 102 from gate stacks 60B of the second circuit 104. Further, source/drain contacts 92 extend to source/drain regions (e.g., epitaxial source/drain regions 42/44, see FIG. 16) on opposite sides of gate stacks 60A and 60B in each of the circuits 102 and 104. The source/drain regions may be formed on fins 24. A contact point 96 may be over and connected to the contact 82, and the contact 96 may be used to apply a voltage to the contact 82, which helps to reduce the isolation leakage current between the two circuits and the two wells 27/29.

Figure 18:
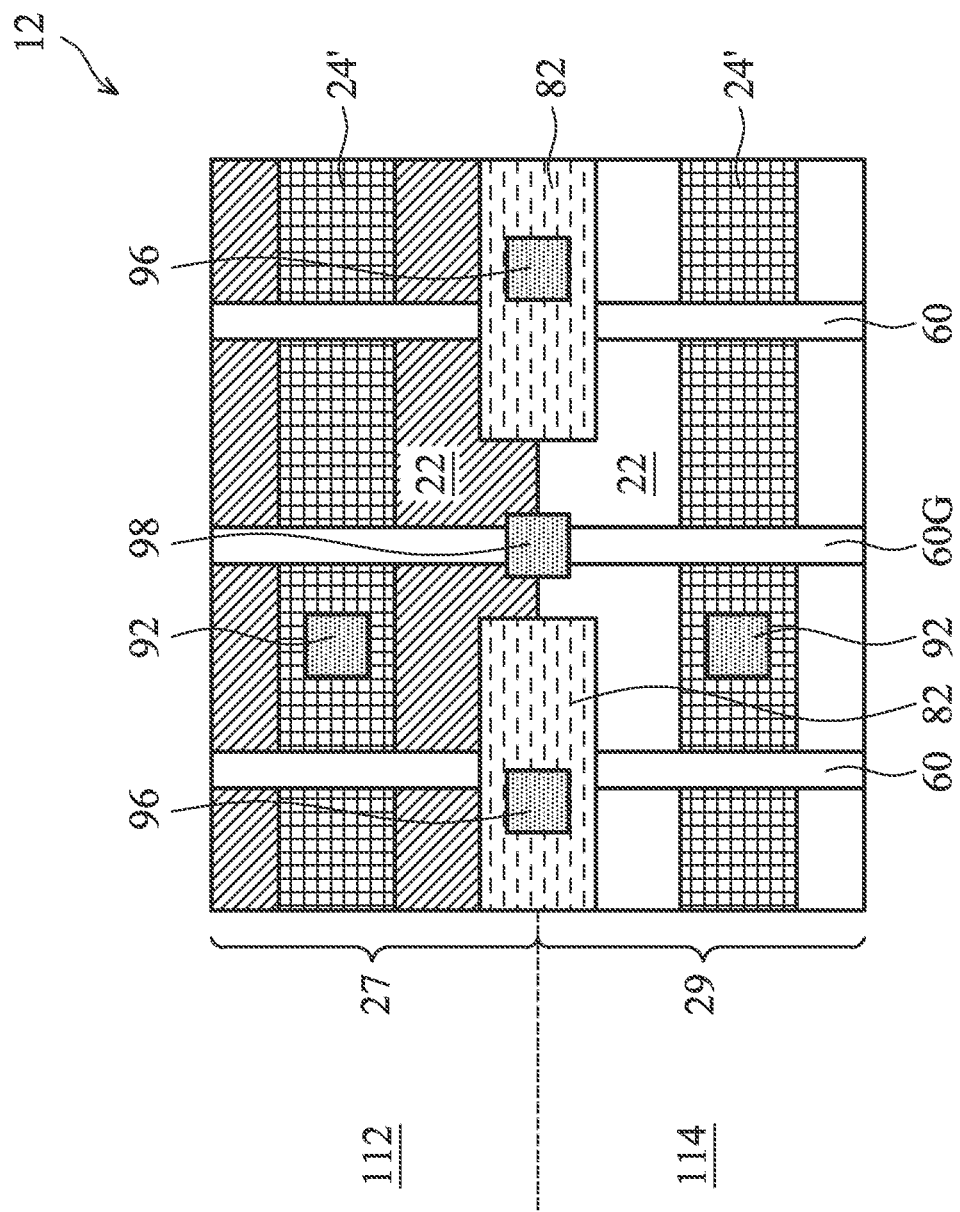

FIG. 18 illustrates a top-down view in accordance with an alternative embodiment of the present disclosure. Wafer 12 has an n-well 27 on which a first circuit 112 is formed and a p-well 29 on which a second circuit 114 is formed. The first circuit 112 and the second circuit 114 are adjacent to each other and have portions that are separated by an STI region 22. The first circuit 112 and the second circuit 114 each comprise a FinFET. The first circuit 112 comprises a p-type FinFET and the second circuit 114 comprises an n-type FinFET, which share a common gate stack 60G. The gate stack 60G extends over the protruding fins 24' of both the p-type FinFET and the n-type FinFET, unlike the first circuit 102 and the second circuit 104 of the example embodiment in FIG. 17, in which there is no shared common gate stack over both the circuits. Contacts 82 extend vertically through the STI region 22 into the wells 27/29 below the STI, at portions of the interface between wells 27/29. Contact 82 does not extend to the portion of the interface between wells 27/29 under the common gate stack 60G. Further, source/drain contacts 92 extend to source/drain regions (e.g., epitaxial source/drain regions 42/44) in each of the circuits 112 and 114. The contact points 96 are used to apply a voltage to the contacts 82, which helps to reduce the isolation leakage current between the two circuits and the two wells 27/29. The gate contact 98 is used to apply a common gate voltage to both first circuit 112 and second circuit 114.

Next, an ILD 108 is deposited over the ILD 48. In an embodiment, ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 19A:
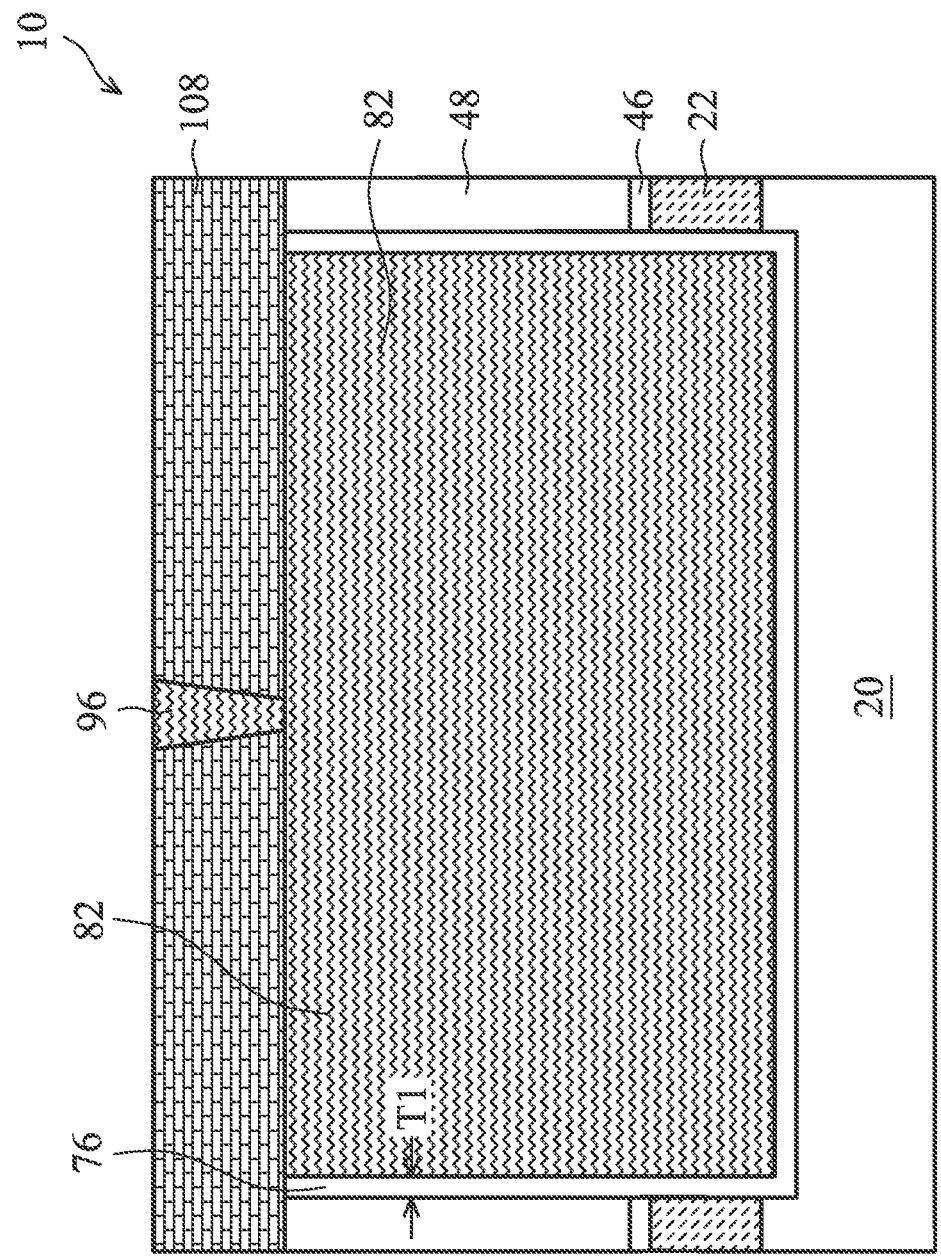
Figure 19B:
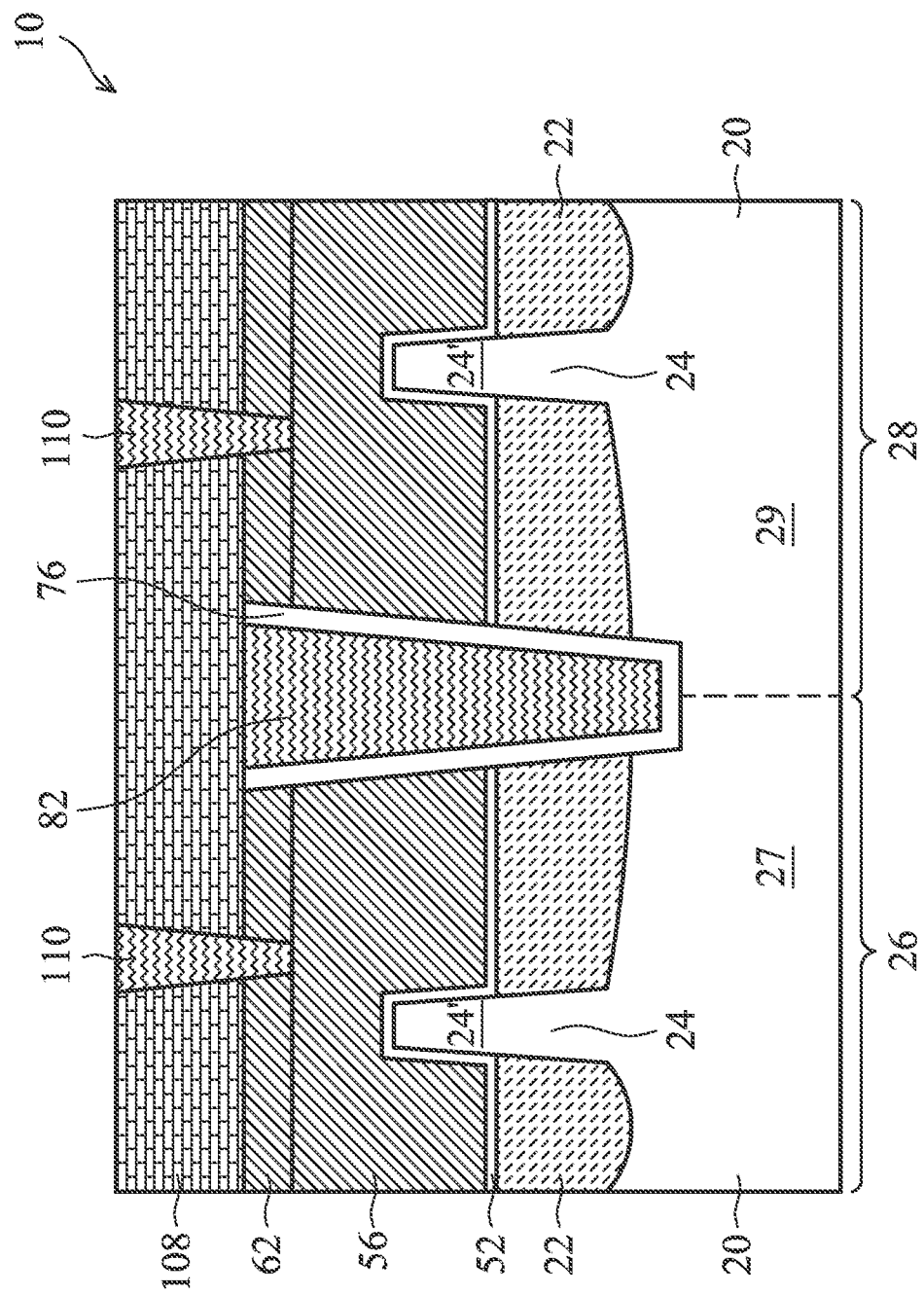
Figure 19C:
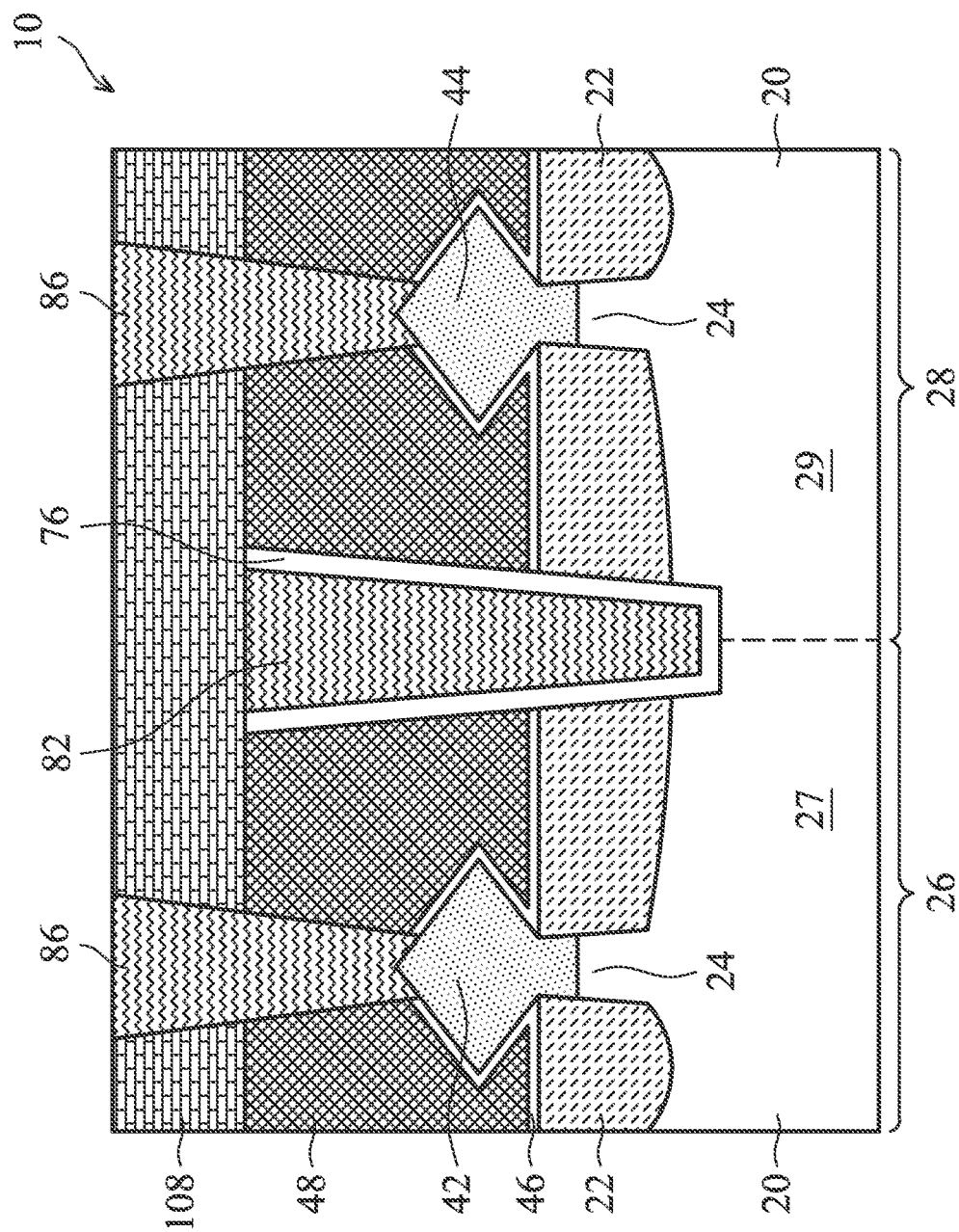

In FIGS. 19A, 19B and 19C, source/drain contacts 86 and gate contacts 110 are formed through ILD 48 and ILD 108 in accordance with some embodiments. FIG. 19A is obtained from the same vertical plane as the vertical plane containing line A-A in FIG. 9. FIG. 19B is obtained from the same vertical plane as the vertical plane containing line B-B in FIG. 9. FIG. 19C is obtained from the same vertical plane as the vertical plane containing line C-C in FIG. 9. Openings for the source/drain contacts 86 are formed through ILDs 48 and 108, and openings for the gate contact 110 are formed through the hard mask 62 and the ILD 108. In addition, an electrical contact 96 is formed in ILD 108 to enable an application of a voltage on contact 82. The opening for electrical contact 96 is formed through ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 86, gate contacts 110 and electrical contact 96 in the openings. An anneal process may be performed to form a silicide at the interface between the epitaxy regions 42/44 and the source/drain contacts 86. The source/drain contacts 86 are physically and electrically coupled to epitaxy regions 42/44, the gate contacts 110 are physically and electrically coupled to the gate electrodes 56 and the electrical contact 96 is physically and electrically coupled to the contact 82. The source/drain contacts 86 and gate contacts 110 and electrical contact 96 may be formed in different processes, or may be formed in the same process. Although shown as being formed in the same cross-sections, it should be appreciated that each of the source/drain contacts 86 and gate contacts 110 and electrical contact 96 may be formed in different cross-sections, which may avoid shorting of the contacts.

Figure 20:
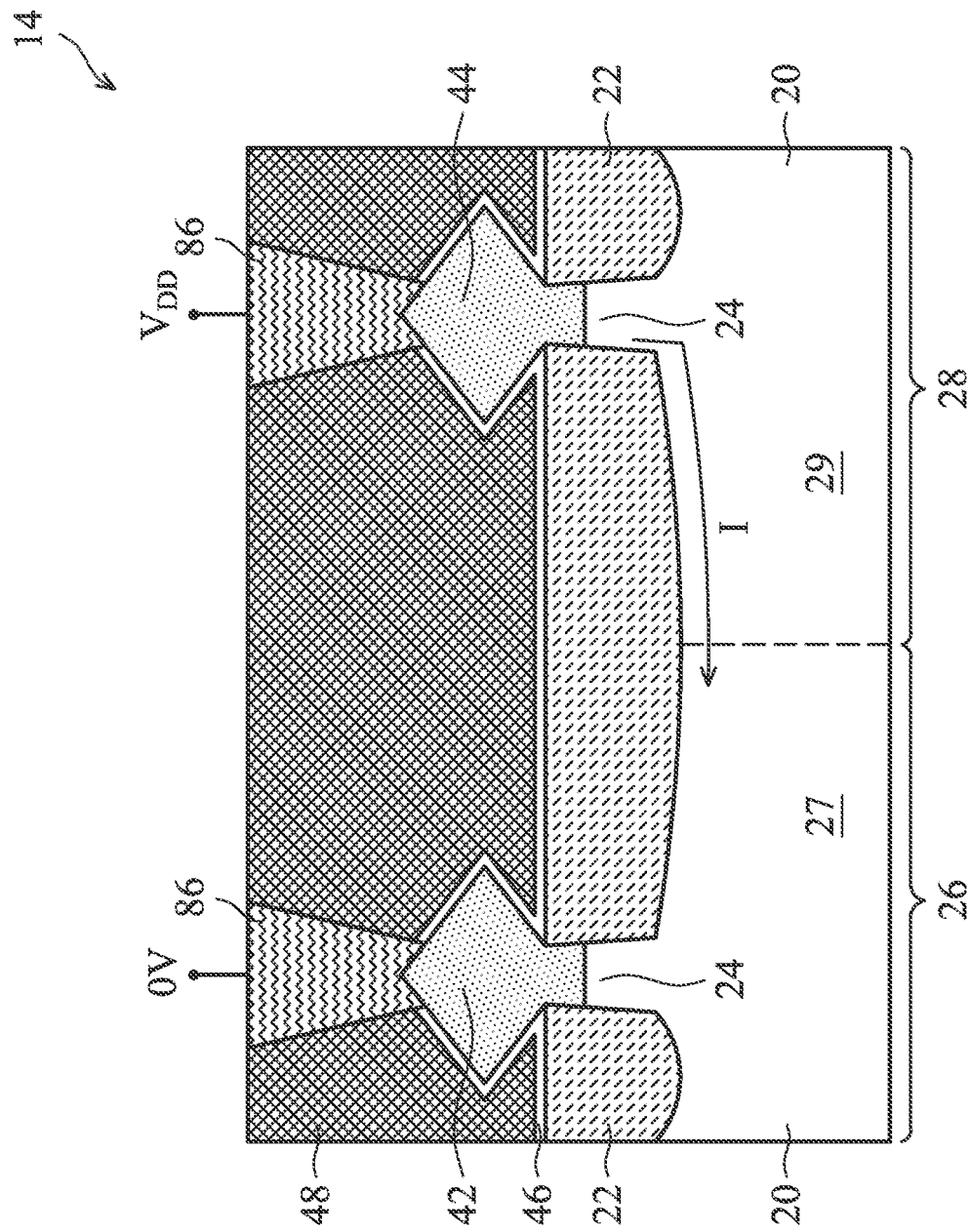
FIG. 20 shows a cross-sectional view of an intermediate stage in the manufacturing of FinFETs without a contact in between two circuits.

The embodiments of the present disclosure have some advantageous features. By utilizing a contact on an STI region between an n-well and a p-well, reduced isolation leakage current can be achieved. Isolation leakage current can occur more readily when a p-well is adjacent to an n-well, and the doping concentrations of the p-well and n-well are not balanced. FIG. 20 shows a cross-sectional view of an intermediate stage in the manufacturing of FinFETs without a contact in between the two circuits. Wafer 14 has similar features to the features discussed above with respect to Wafer 10 described previously, where like reference numbers are used to designate like elements and like features are formed using like processes. Isolation leakage current readily occurs when the doping concentration in region 26 and region 28 is not balanced. For example, if the doping concentration in the p-well 29 is lower than that of the n-well 27, an isolation leakage current I may flow from the n-doped epitaxy region 44 to the n-well 27 when the epitaxy region 44 is biased at $V_{DD}$. Conversely, when the doping concentration in the p-well 29 is higher than that of the n-well 27, an isolation leakage current I may flow from the p-doped epitaxy region 42 to the p-well 29 when the epitaxy region 42 is biased at $V_{DD}$. The leakage current can be worsened by a charge build up in the STI region 22 at or near an interface between the STI region 22 and n-well 27/p-well 29. If the STI region 22 has an STI liner, this STI liner may accumulate a charge and lead to a change in potential at or near the interface between the STI region 22 and n-well 27/p-well 29. If the accumulated charges are positive, they can invert the surface of the p-well/region 28 and create an n-type conducting path, increasing leakage current. In addition, dopant control of regions of the n-well 27/p-well 29 at or near the interface between the STI region 22 and n-well 27/p-well 29 is harder than for other regions of n-well 27/p-well 29.

FIG. 21 shows the FinFETs described above in FIG. 19C where the epitaxy region 44 is biased at $V_{DD}$. The contact 82 extends into both the n-well 27 and p-well 29 of substrate 20 directly under STI region 22. A bias, $V_C$ is applied to the contact, which reduces leakage current from the n-doped epitaxy region 44 to the n-well 27. For example, applying a bias, $V_C = -V_{DD}$ to the contact 82 causes an accumulation of holes 144 below the STI region 22 in the area around the contact 82. The holes 144, provide a further barrier between the n-doped epitaxy region 44 and n-well 27, reduces the conduction path between n-doped epitaxy region 44 and n-well 27, and as a result reduces isolation leakage current I from n-doped epitaxy region 44 to the n-well 27 when the epitaxy region 44 is biased at $V_{DD}$. The absolute magnitude of the bias $V_C$ may be selected according to a thickness T1 of the dielectric liner 76. The absolute magnitude of the bias $V_C$ is linearly proportional to the thickness T1 of the dielectric liner 76, such that the absolute magnitude of the bias $V_C$ increases with an increase in the thickness T1 of the dielectric liner 76. Likewise, the absolute magnitude of the bias $V_C$ will be smaller with a decrease in the thickness T1 of the dielectric liner 76. In some embodiments with $V_{DD}=0.75V$, the bias $V_C$ may in a range of about −0.4V to about −3.3V to provide a sufficient accumulation of holes when a thickness of the dielectric liner is in a range of about 1 nm to about 5 nm.

Figure 22:
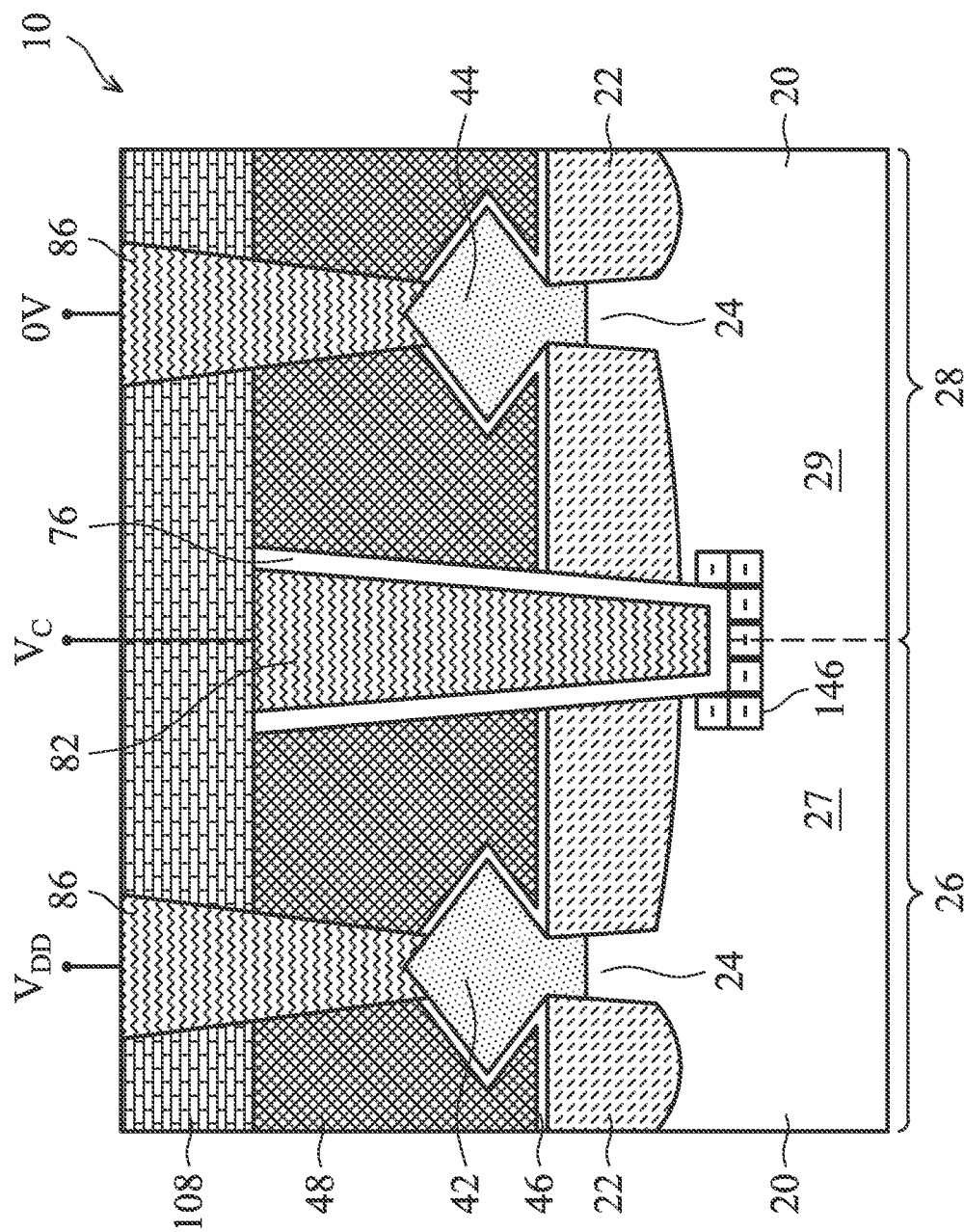

Likewise in FIG. 22, the potential profile can be controlled to increase the electron concentration 146 below the STI region 22 in the area around the contact 82 and reduce the conduction path that allows isolation leakage current I from p-doped epitaxy region 42 to the p-well 29 when the epitaxy region 42 is biased at $V_{DD}$. In some embodiments with $V_{DD}=-0.75V$, a magnitude of the bias $V_C$ may in a range of about 0.5V to about 3.3V to provide a sufficient accumulation of electrons when a thickness of the dielectric liner is in a range of about 1 nm to about 5 nm.

Figure 23:
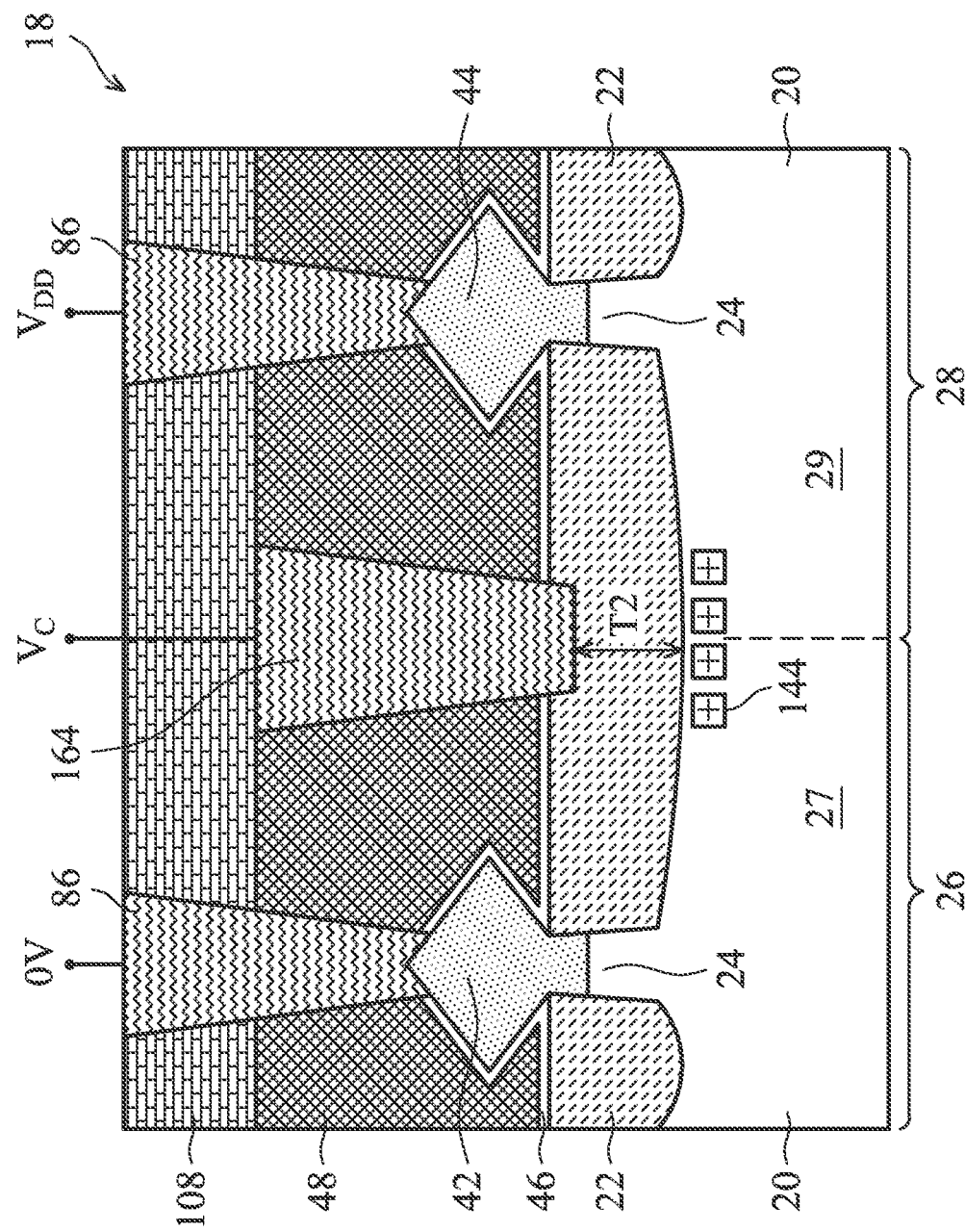
Figure 24B:
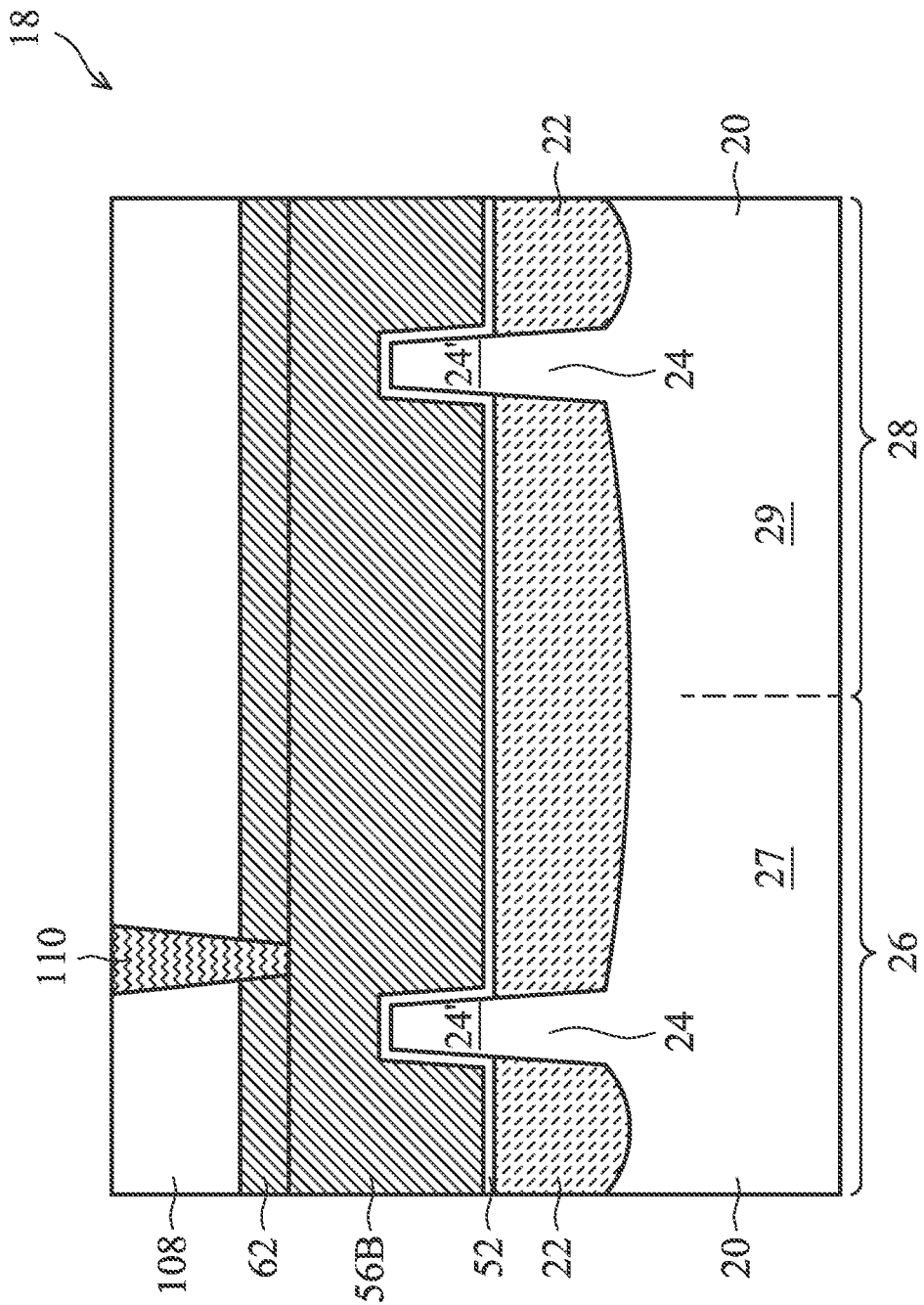

FIGS. 23, 24A, and 24B illustrate cross-sectional views of an alternate embodiment of the present disclosure. Wafer 18 may be similar to the features of wafer 10 discussed above with respect to FIGS. 19B and 21 where like features are formed using like processes. Further description of these features is omitted for brevity. FIG. 23 shows a cross-section along a line through the epitaxy regions and parallel to lengthwise directions of gate electrodes 56A and 56B (see FIGS. 24A and 24B). FIG. 23 shows a first FinFET having an epitaxy region 44 biased at $V_{DD}$, and a second FinFET having an epitaxy region 42 at 0V. FIG. 24A shows a cross-sectional view along a line through the gate electrode 56A, and FIG. 24B shows a cross-sectional view along a line through the gate electrode 56B. The gate electrode 56A is adjacent to the epitaxy region 44, and provides a gate electrode for the first FinFET of FIG. 23, and the gate electrode 56B is adjacent to the epitaxy region 42, and provides a gate electrode for the second FinFET of FIG. 23. The gate electrodes 56A and 56B are electrically isolated by the ILD 48. The contact 164 extends through ILD 48 and may be on top of or extend partially into STI region 22. The embodiment of FIGS. 23, 24A, and 24B differs from the embodiment of FIG. 21 in that contact 164 does not extend through a gate electrode (e.g., gate electrodes 56A or 56B). The contact 164 may be formed in a similar process to source/drain contacts 86. The contact 164 and may be formed before, after, or at the same time as source/drain contacts 86. The contact 164 may comprise a liner, such as a diffusion barrier layer, an adhesion layer, or the like, and a conductive material. The liner may include titanium oxide, titanium nitride, tantalum oxide, tantalum nitride, or the like. The conductive material may be copper, a copper alloy, silver, gold, tungsten, cobalt, aluminum, nickel, or the like.

A bias, $V_C$ is applied to the contact 164, which reduces leakage current from the n-doped epitaxy region 44 to the n-well 27. For example, applying a bias, $V_C$ to the contact 164 causes an accumulation of holes 144 below the STI region 22 that is directly under the bottom surface of the contact 164. The holes 144, provide a further barrier between the n-doped epitaxy region 44 and n-well 27, reduces the conduction path between n-doped epitaxy region 44 and n-well 27, and as a result reduces isolation leakage current I from n-doped epitaxy region 44 to the n-well 27 when the epitaxy region 44 is biased at $V_{DD}$. The absolute magnitude of the bias, $V_C$ may be selected according to a thickness T2 of the STI region 22 under the bottom surface of the contact 164. For example, the absolute magnitude of the bias $V_C$ may be linearly proportional to the thickness T2, such that the absolute magnitude of the bias $V_C$ increases with an increase in the thickness. Likewise, the absolute magnitude of the gate bias $V_C$ will be smaller with a decrease in the thickness T2. In some embodiments with $V_{DD}$=0.75V, a magnitude of the bias $V_C$ may in a range of about −3.3V to about −6.8V to provide a sufficient accumulation of holes when a thickness of the STI region 22 below the bottom surface of the contact 164 is in a range of about 5 nm to about 10 nm.

Figure 25:
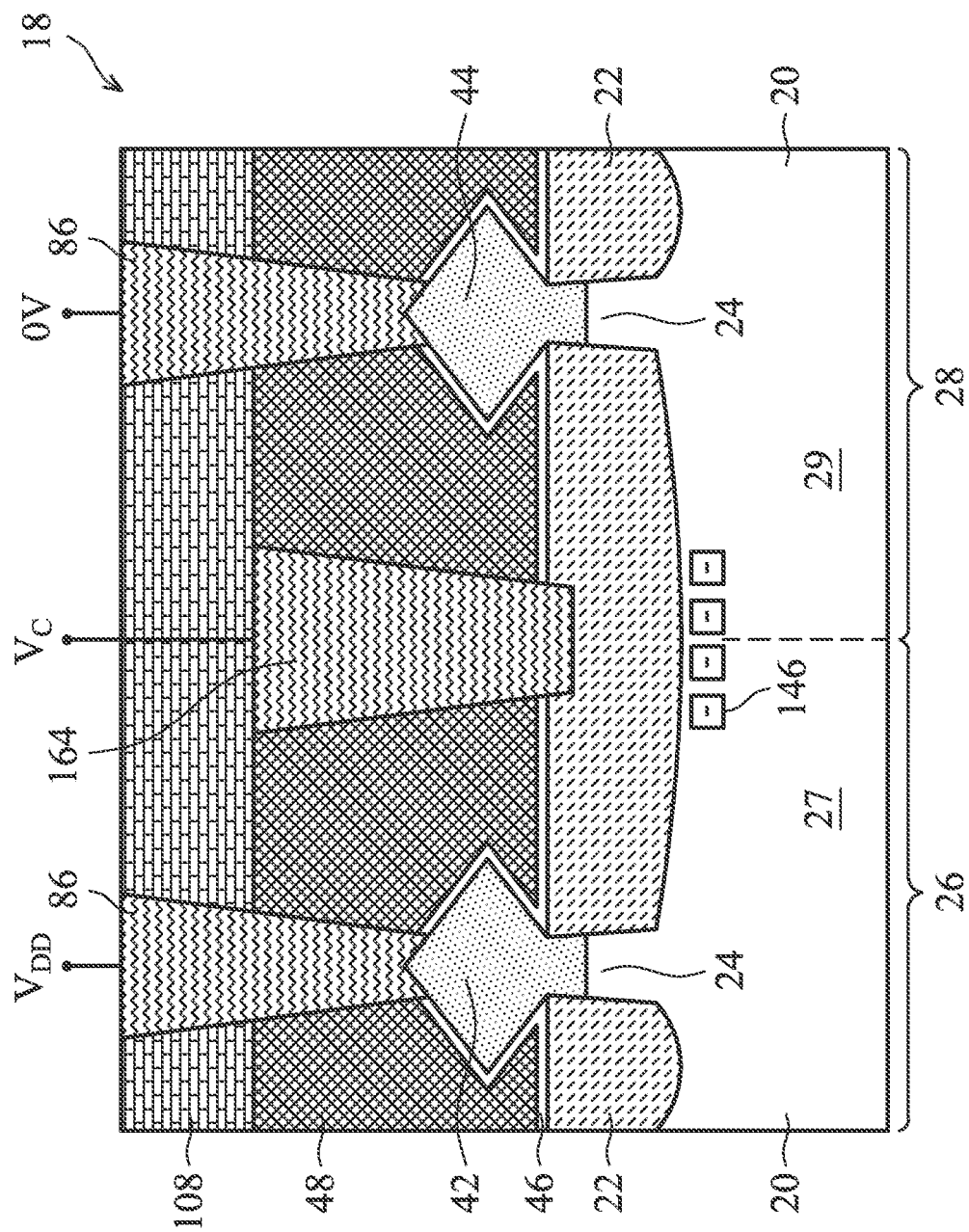

Likewise in FIG. 25, the potential profile of the alternate embodiment referenced in FIGS. 23, 24A, and 24B can be controlled to increase the electron concentration 146 below the STI region 22 that is directly under the bottom surface of the contact 164 and reduce the conduction path that allows isolation leakage current I from p-doped epitaxy region 42 to the p-well 29 when the epitaxy region 42 is biased at $V_{DD}$. In some embodiments with $V_{DD}$=−0.75V, a magnitude of the bias $V_C$ may in a range of about 3.3V to about 6.8V to provide a sufficient accumulation of electrons when a thickness of the STI region 22 below the bottom surface of the contact 164 is in a range of about 5 nm to about 10 nm.

Figure 26:
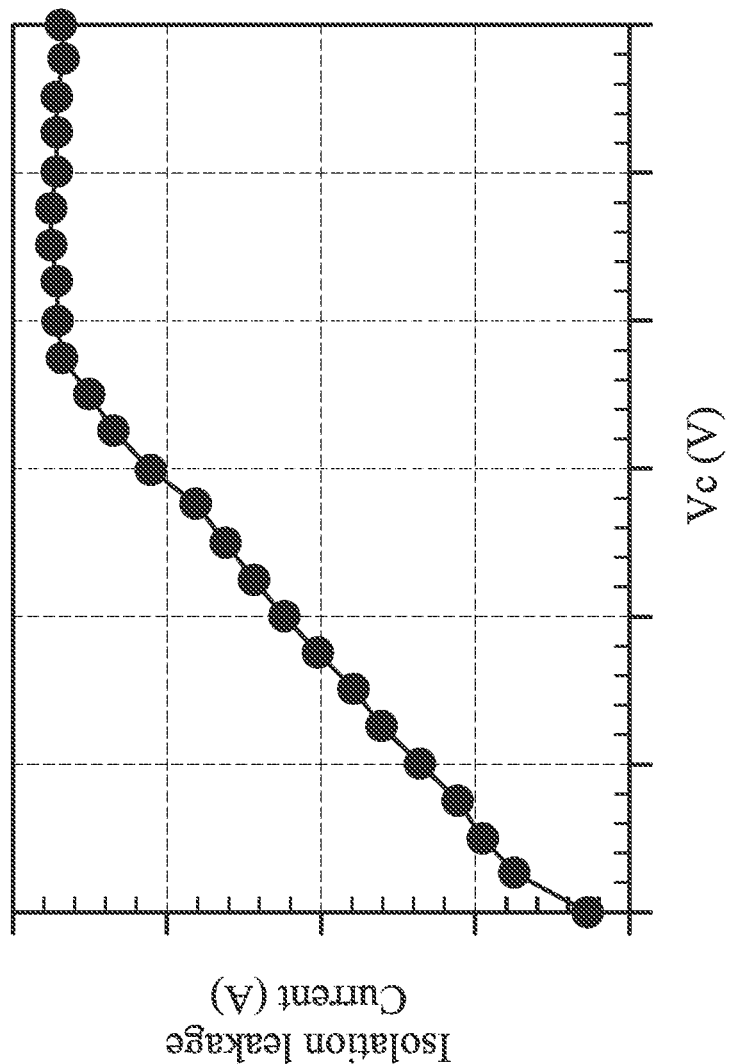
FIG. 26 shows a leakage current versus gate bias trace for a FinFET referenced in FIG. 23.

FIG. 26 shows a leakage current versus gate bias trace for one of the FinFETs described above in FIGS. 23 and 24. The application of a more negative bias, $V_C$, to the contact 164, leads to the reduction of leakage current from the n-doped epitaxy region 44 to the n-well 27 by causing a higher accumulation of holes 144 below the STI region 22 in the area directly under the contact 164. The increased number of holes 144, provide a further barrier between the n-doped epitaxy region 44 and n-well 27, reducing the conduction path between n-doped epitaxy region 44 and n-well 27, and as a result reducing isolation leakage current I from n-doped epitaxy region 44 to the n-well 27 when the epitaxy region 44 is biased at $V_{DD}$.

Figure 27:
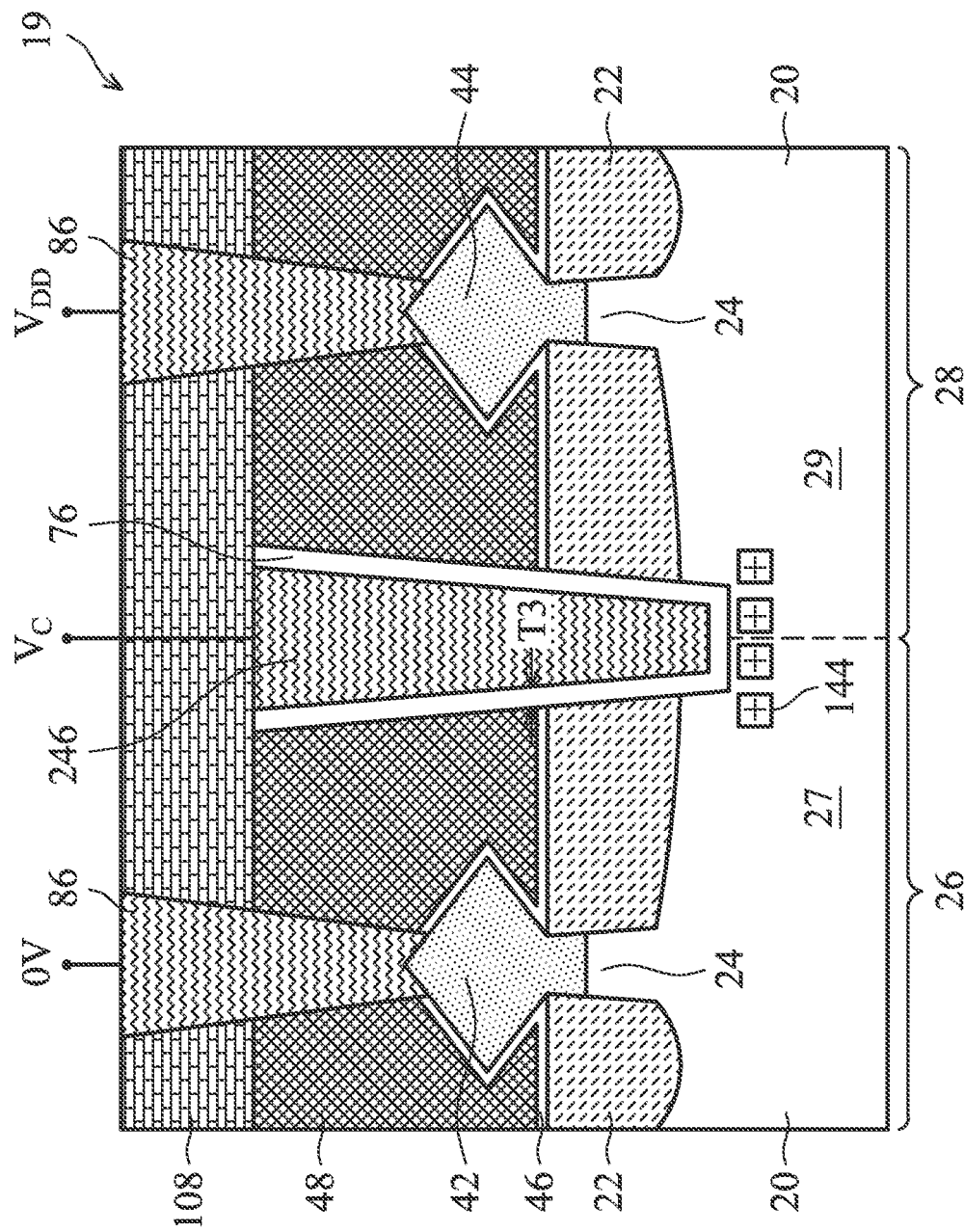
FIGS. 27, 28A, 28B and 29 illustrate an alternative embodiment of the present disclosure in which the epitaxy regions are biased at $V_{DD}$.
Figure 28A:
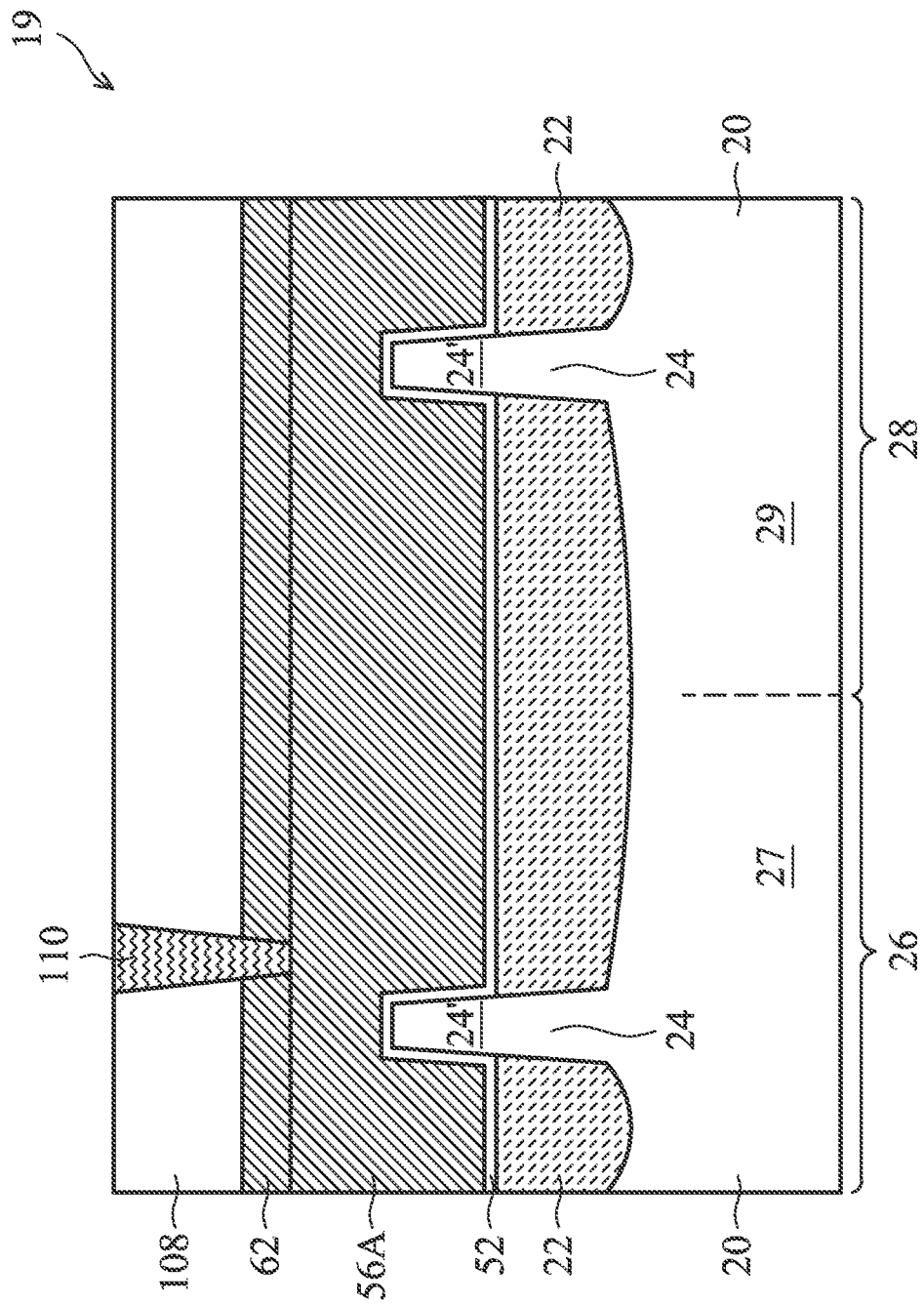
Figure 28B:
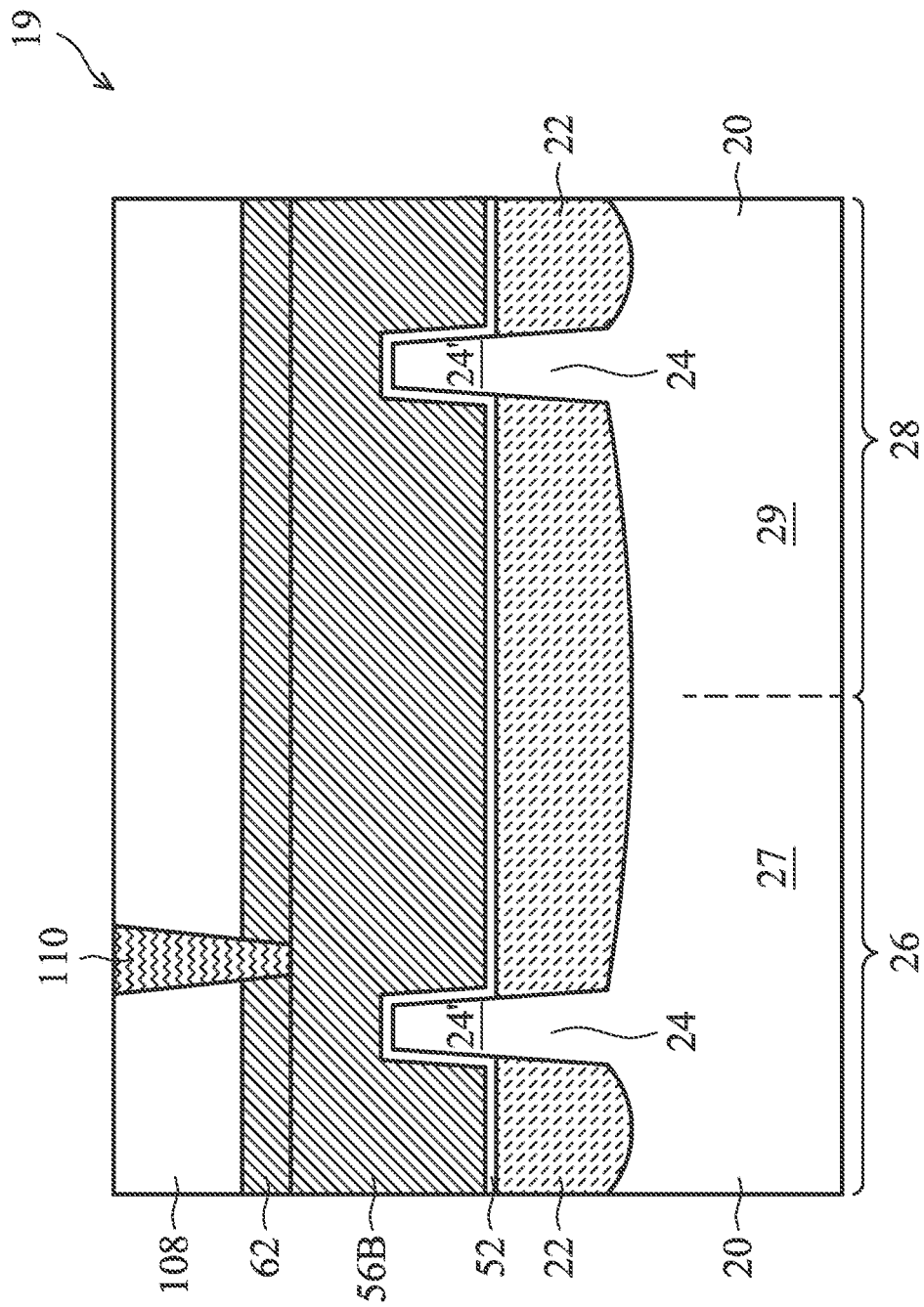

FIGS. 27, 28A, and 28B illustrate a cross-sectional view of another alternate embodiment of the present disclosure. Wafer 19 may be similar to the features of wafer 18 discussed above with respect to FIGS. 23, 24A, and 24B where like features are formed using like processes. Further description of these features is omitted for brevity. FIG. 27 shows a cross-section along a line through the epitaxy regions and parallel to lengthwise directions of gate electrodes 56A and 56B (see FIGS. 28A and 28B). FIG. 27 shows a first FinFET having an epitaxy region 44 biased at $V_{DD}$, and a second FinFET having an epitaxy region 42 at 0V. FIG. 28A shows a cross-sectional view along a line through the gate electrode 56A, and FIG. 28B shows a cross-sectional view along a line through the gate electrode 56B. The gate electrode 56A of FIG. 28A is adjacent to the epitaxy region 44, and provides a gate electrode for the first FinFET of FIG. 27. The gate electrode 56B of FIG. 28B is adjacent to the epitaxy region 42, and provides a gate electrode for the second FinFET of FIG. 27. The gate electrodes 56A and 56B are electrically isolated by the ILD 48. The embodiment of FIGS. 27, 28A, and 28B differs from the embodiment of FIG. 21 in that contact 246 does not extend through a gate electrode (e.g., gate electrodes 56A or 56B). The contact 246 extends into ILD 48, STI region 22 and partially into both region 26 and region 28 of the bulk portion of substrate 20 directly under STI region 22. The contact 246 may be formed before, after, or at the same time as source/drain contacts 86. The contact 246 may comprise a dielectric liner 76, and a conductive material. Dielectric liner 76 may comprise silicon nitride, silicon oxide, silicon oxynitride, or the like, and may be formed by an ALD, CVD, or the like process. The thickness T3 of the dielectric liner 76 may be in a range of about 1 nm to about 5 nm. The conductive material may be copper, a copper alloy, silver, gold, tungsten, cobalt, aluminum, nickel, or the like.

A bias, $V_C$ is applied to the contact 246, which reduces leakage current from the n-doped epitaxy region 44 to the n-well 27. For example, applying a bias, $V_C$ to the contact 246 causes an accumulation of holes 144 below the STI region 22 in the area around the contact 246. The holes 144, provide a further barrier between the n-doped epitaxy region 44 and n-well 27, reduces the conduction path between n-doped epitaxy region 44 and n-well 27, and as a result reduces isolation leakage current I from n-doped epitaxy region 44 to the n-well 27 when the epitaxy region 44 is biased at $V_{DD}$. The magnitude of the bias, $V_C$ may be linearly proportional to the thickness of the dielectric liner 76, such that the magnitude of the bias $V_C$ increases with an increase in the thickness T3 of the dielectric liner 76. Likewise, the magnitude of the bias $V_C$ will be smaller with a decrease in the thickness T3 of the dielectric liner 76. In some embodiments with $V_{DD}$=0.75V, a magnitude of the bias $V_C$ may in a range of about −0.4V to about −3.3V to provide a sufficient accumulation of holes when a thickness of the dielectric liner is in a range of about 1 nm to about 5 nm.

Figure 29:
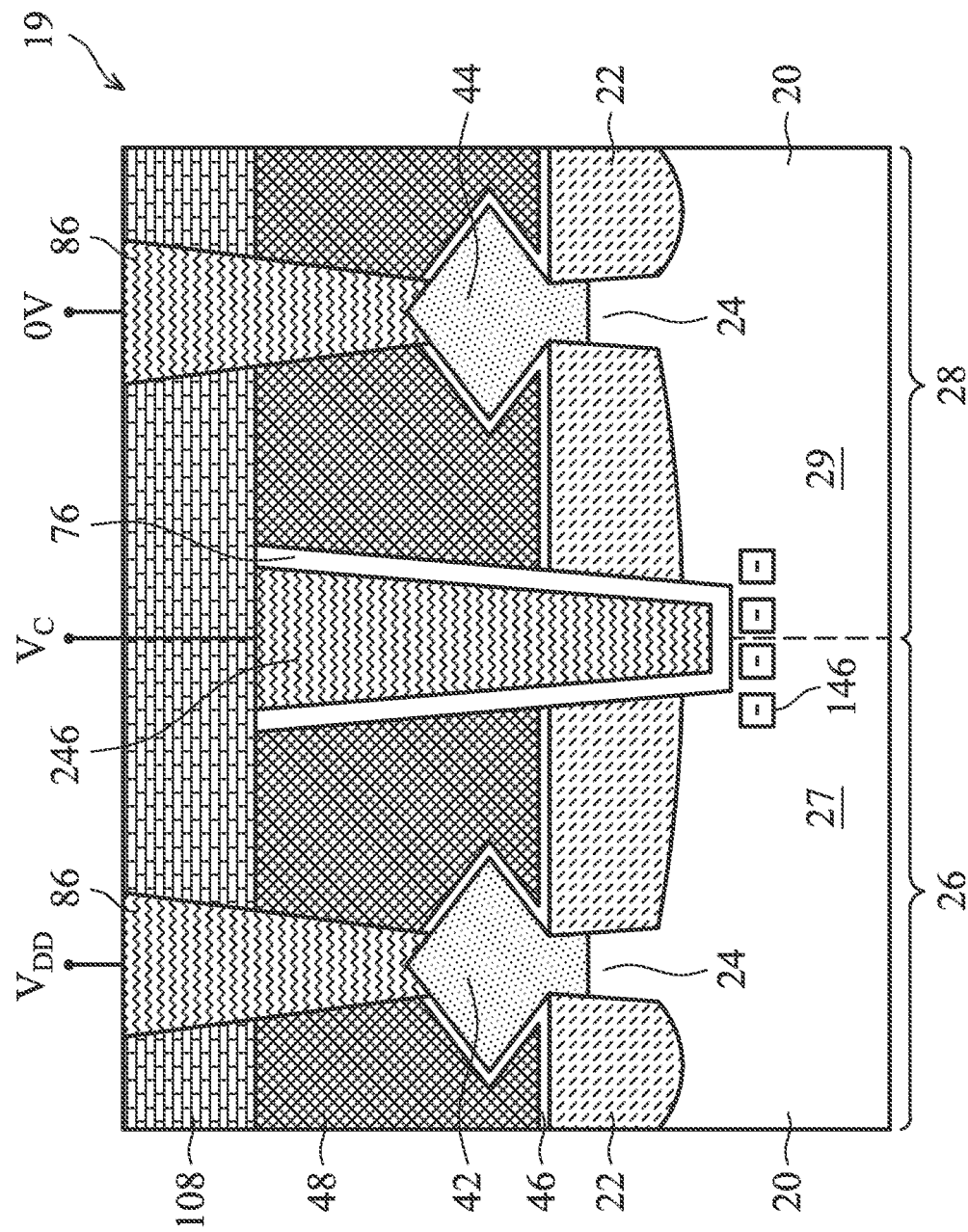

Likewise in FIG. 29, the potential profile of the alternate embodiment referenced in FIGS. 27, 28A and 28B can be controlled to increase the electron concentration 146 below the STI region 22 that is directly under the bottom surface of the contact 246 and reduce the conduction path that allows isolation leakage current I from p-doped epitaxy region 42 to the p-well 29 when the epitaxy region 42 is biased at $V_{DD}$. In some embodiments with $V_{DD}$=−0.75V, a magnitude of the bias $V_C$ may in a range of about 0.4V to about 3.3V to provide a sufficient accumulation of electrons when a thickness of the dielectric liner is in a range of about 1 nm to about 5 nm.

The embodiments of the present disclosure have some advantageous features. By utilizing a contact to a STI region between an n-well and a p-well, reduced isolation leakage current can be achieved. Isolation leakage current can occur more readily when a p-well is adjacent to an n-well, and the doping concentrations of the p-well and n-well are not balanced. This isolation leakage is reducible by applying a controlled voltage to a contact that is on or passes through a STI region between an n-well and a p-well. In addition, the process for forming the contact on or passing through the STI region can be readily incorporated into already existing process flows.

In accordance with an embodiment, a method includes forming a first semiconductor strip protruding above a first region of a substrate and a second semiconductor strip protruding above a second region of the substrate; forming an isolation region between the first semiconductor strip and the second semiconductor strip; forming a gate stack over and along sidewalls of the first semiconductor strip and the second semiconductor strip; etching a trench extending into the gate stack and isolation regions, the trench exposes the first region of the substrate and the second region of the substrate; forming a dielectric layer on sidewalls and a bottom surface of the trench; and filling a conductive material over the dielectric layer and in the trench to form a contact, where the contact extends below a bottommost surface of the isolation region. In an embodiment, the first region of the substrate and the second region of the substrate are oppositely doped. In an embodiment, a dopant concentration of the first region of the substrate and a dopant concentration of the second region of the substrate are different. In an embodiment, etching the trench includes using an etching gas including $Cl_2$, $BCl_3$, Ar, $CH_4$, $CF_4$, or a combination thereof. In an embodiment, a first circuit is formed on the first region of the substrate and a second circuit is formed on the second region of the substrate, where the first circuit is independent from the second circuit. In an embodiment, forming the dielectric layer results in the dielectric layer having a thickness in a range of 1 nm to 5 nm. In an embodiment, the dielectric layer electrically isolates the gate stack from the contact. In an embodiment, the contact separates the gate stack into a first portion and a second portion on opposite sides of the contact, where the first portion of the gate stack is electrically isolated from the second portion of the gate stack.

In accordance with yet another embodiment, a semiconductor structure includes a first fin protruding from a first region of a semiconductor substrate; a second fin protruding from a second region of the semiconductor substrate, the first region of the semiconductor substrate being adjacent to the second region of the semiconductor substrate; an isolation region between the first fin and the second fin; and a contact extending into the isolation region, the contact overlaps the first region of the semiconductor substrate and the second region of the semiconductor substrate, the contact includes conductive material. In an embodiment, the first region of the semiconductor substrate is oppositely doped from the second region of the semiconductor substrate. In an embodiment, a bottommost surface of the contact is lower than a bottommost surface of the isolation region. In an embodiment, a first portion of the contact directly contacts the first region of the semiconductor substrate and a second portion of the contact directly contacts the second region of the semiconductor substrate. In an embodiment, further including a gate stack over and along sidewalls of the first fin and the second fin, where the contact extends into the gate stack, and where the contact includes a dielectric liner on a bottom surface and sidewalls of the conductive material. In an embodiment, the dielectric liner has a thickness in a range of 1 nm to 5 nm. In an embodiment, the dielectric liner electrically isolates a first portion of the gate stack from a second portion of the gate stack, the first portion of the gate stack is on an opposite side of the contact as the second portion of the gate stack.

In accordance with yet another embodiment, a semiconductor structure includes a substrate having a first region and a second region, where the first region of the substrate is adjacent to the second region of the substrate; a first fin extending from the first region of the substrate; a second fin extending from the second region of the substrate; an insulating layer interposed between the first fin and the second fin, where a top surface of the insulating layer is lower than top surfaces of the first fin and second fin; a gate stack over and along sidewalls of the first fin and the second fin; and a conductive contact extending through the gate stack and into the insulating layer, a dielectric liner surrounding the conductive contact electrically isolates the conductive contact from the gate stack. In an embodiment, the conductive contact includes tungsten, cobalt, copper, a combination thereof. In an embodiment, a bottommost surface of the conductive contact directly contacts the insulating layer. In an embodiment, a thickness of the insulating layer between the bottommost surface of the conductive contact and a top surface of the substrate is about 80 nm or less. In an embodiment, a doping concentration of the first region of the substrate and the second region of the substrate are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first semiconductor strip protruding above a first region of a substrate and a second semiconductor strip protruding above a second region of the substrate;
    forming an isolation region between the first semiconductor strip and the second semiconductor strip;
    forming a gate stack over and along sidewalls of the first semiconductor strip and the second semiconductor strip;
    etching a trench extending into the gate stack and isolation region, the trench exposing the first region of the substrate and the second region of the substrate;
    forming a dielectric layer on sidewalls and a bottom surface of the trench; and
    filling a conductive material over the dielectric layer and in the trench to form a contact, wherein the contact extends below a bottommost surface of the isolation region.

2. The method of claim 1, wherein the first region of the substrate comprises first dopants, wherein the second region of the substrate comprises second dopants, and where the first region and the second region are oppositely doped.

3. The method of claim 2, wherein a dopant concentration of the first dopants in the first region of the substrate and a dopant concentration of the second dopants in the second region of the substrate are different.

4. The method of claim 1, wherein etching the trench comprises using an etching gas comprising $Cl_2$, $BCl_3$, Ar, $CH_4$, $CF_4$, or a combination thereof.

5. The method of claim 1, wherein a first circuit is formed on the first region of the substrate and a second circuit is formed on the second region of the substrate, wherein the first circuit is independent from the second circuit.

6. The method of claim 1, wherein forming the dielectric layer results in the dielectric layer having a thickness in a range of 1 nm to 5 nm.

7. The method of claim 1, wherein the dielectric layer electrically isolates the gate stack from the contact.

8. The method of claim 1, wherein etching the trench comprises separating the gate stack into a first gate stack and a second gate stack on opposite sides of the trench, wherein the first gate stack is electrically isolated from the second gate stack after forming the contact in the trench.

9. A method of forming a semiconductor device, the method comprising:
- forming a first fin that extends from a first region of a semiconductor substrate and a second fin that extends from a second region of the semiconductor substrate, wherein the first region is adjacent to the second region;
- depositing an insulating material between the first fin and the second fin;
- depositing a gate dielectric layer over and along sidewalls of the first fin and the second fin;
- depositing a gate electrode layer over the gate dielectric layer;
- forming a trench between the first fin and the second fin that extends into the insulating material, the gate dielectric layer, and the gate electrode layer;
- forming a dielectric layer on sidewalls and a bottom surface of the trench; and
- forming a conductive contact in the trench, wherein the conductive contact overlaps the first region of the semiconductor substrate and the second region of the semiconductor substrate, and wherein forming the conductive contact in the trench comprises forming the conductive contact over the dielectric layer.

10. The method of claim 9, wherein forming the trench between the first fin and the second fin comprises:
- forming a patterned mask over the insulating material, the gate dielectric layer, the gate electrode layer, the first fin, and the second fin; and
- etching the insulating material, the gate dielectric layer and the gate electrode layer using the patterned mask as an etching mask.

11. The method of claim 10, wherein etching the insulating material, the gate dielectric layer and the gate electrode layer comprises using an etching gas comprising $Cl_2$, $BCl_3$, Ar, $CH_4$, $CF_4$, or a combination thereof.

12. The method of claim 10 further comprising:
- after forming the trench, using oxygen to remove a polymer layer on a bottom surface of the trench.

13. The method of claim 9, wherein a thickness of the dielectric layer is in a range from 1 nm to 5 nm.

14. A method comprising:
- depositing a first dielectric layer between a first fin and a second fin;
- forming a metal gate structure over the first fin and the second fin, wherein the metal gate structure is surrounded by a second dielectric material;
- forming a patterned mask layer over the metal gate structure and the second dielectric material, wherein an opening of the patterned mask layer exposes a portion of the metal gate structure and a portion of the second dielectric material;
- removing the portions of the metal gate structure and the second dielectric material exposed by the opening of the patterned mask layer to form a trench; and
- depositing a conductive material in the trench, wherein a top of the conductive material has a larger width than a bottom of the conductive material.

15. The method of claim 14 further comprising:
- etching a portion of the first dielectric layer using the patterned mask layer as an etch mask to extend the trench.

16. The method of claim 14 further comprising:
- depositing a third dielectric layer on sidewalls and a bottom surface of the trench prior to depositing the conductive material.

17. The method of claim 14, wherein the trench separates the metal gate structure into a first gate structure and a second gate structure, and wherein the first gate structure is electrically isolated from the second gate structure.

18. The method of claim 16, wherein the conductive material extends partially through the first dielectric layer such that a top surface of the first dielectric layer is in physical contact with a bottommost surface of the conductive material.

19. The method of claim 16, wherein the conductive material extends completely through the first dielectric layer such that a bottommost surface of the conductive material is below a bottommost surface of the first dielectric layer.

20. The method of claim 9, wherein the dielectric layer comprises silicon nitride, silicon oxide, or silicon oxynitride.

* * * * *